US009666925B2

(12) United States Patent
Yosui et al.

(10) Patent No.: US 9,666,925 B2
(45) Date of Patent: May 30, 2017

(54) TRANSMISSION LINE, A TRANSMISSION LINE APPARATUS, AND AN ELECTRONIC DEVICE

(71) Applicant: Murata Manufacturing Co., Ltd., Nagaokakyo-shi, Kyoto-fu (JP)

(72) Inventors: Kuniaki Yosui, Nagaokakyo (JP); Nobuo Ikemoto, Nagaokakyo (JP); Shigeru Tago, Nagaokakyo (JP); Zhujun Yang, Nagaokakyo (JP); Jun Sasaki, Nagaokakyo (JP); Fumie Matsuda, Nagaokakyo (JP); Wataru Tamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 148 days.

(21) Appl. No.: 14/796,027

(22) Filed: Jul. 10, 2015

(65) Prior Publication Data

US 2015/0318595 A1 Nov. 5, 2015

Related U.S. Application Data

(63) Continuation of application No. PCT/JP2014/050493, filed on Jan. 15, 2014.

(30) Foreign Application Priority Data

Jan. 23, 2013 (JP) .................. 2013-010009
Jul. 10, 2013 (JP) .................. 2013-145039
Nov. 11, 2013 (JP) .................. 2013-232710

(51) Int. Cl.
*H05K 7/00* (2006.01)
*H01P 3/02* (2006.01)
(Continued)

(52) U.S. Cl.
CPC .............. *H01P 3/026* (2013.01); *H01P 3/085* (2013.01); *H05K 1/025* (2013.01); *H05K 1/0225* (2013.01);
(Continued)

(58) Field of Classification Search
CPC .... H05K 1/028; H05K 1/0221–1/0224; H05K 1/0253; H01B 7/08; H01P 3/058; H01P 5/028
(Continued)

(56) References Cited

U.S. PATENT DOCUMENTS

2004/0065472 A1* 4/2004 Sekijima ............ H01R 23/6873
174/250
2012/0097433 A1 4/2012 Kato et al.
(Continued)

FOREIGN PATENT DOCUMENTS

JP 4962660 B2 6/2012
WO 2010/150588 A1 12/2010
(Continued)

OTHER PUBLICATIONS

Official Communication issued in International Patent Application No. PCT/JP2014/050493, mailed on Apr. 15, 2014.

Primary Examiner — Tuan T Dinh
(74) Attorney, Agent, or Firm — Keating & Bennett, LLP

(57) ABSTRACT

A main transmission line includes a substantially elongated dielectric body in which first and second substantially elongated signal conductors are disposed with a distance therebetween in a width direction. A first reference ground conductor and a first auxiliary ground conductor sandwich therebetween the first signal conductor in a thickness direction. A second reference ground conductor and a second auxiliary ground conductor sandwich therebetween the second signal conductor in the thickness direction. The second
(Continued)

auxiliary ground conductor includes two substantially elongated conductors and a first bridge conductor, and the second auxiliary ground conductor includes two substantially elongated conductors and a second bridge conductor. The positions of the first and second bridge conductors in a lengthwise direction are different.

18 Claims, 11 Drawing Sheets

(51) Int. Cl.
    *H05K 1/18*     (2006.01)
    *H05K 1/02*     (2006.01)
    *H01P 3/08*     (2006.01)
    *H05K 1/14*     (2006.01)

(52) U.S. Cl.
    CPC ............. *H05K 1/0242* (2013.01); *H05K 1/18* (2013.01); *H05K 1/028* (2013.01); *H05K 1/0227* (2013.01); *H05K 1/147* (2013.01); *H05K 2201/09618* (2013.01); *H05K 2201/09727* (2013.01)

(58) Field of Classification Search
    USPC ..... 361/777–780, 803, 760–762; 333/12, 26, 333/33, 161, 170; 174/110 F, 117, 174/250–254
    See application file for complete search history.

(56) References Cited

U.S. PATENT DOCUMENTS

2012/0274423 A1\* 11/2012 Kato .................. H01P 1/20363
    333/238
2014/0048312 A1     2/2014 Kato et al.

FOREIGN PATENT DOCUMENTS

WO     2011/007660 A1     1/2011
WO     2013/190859 A1     12/2013

\* cited by examiner

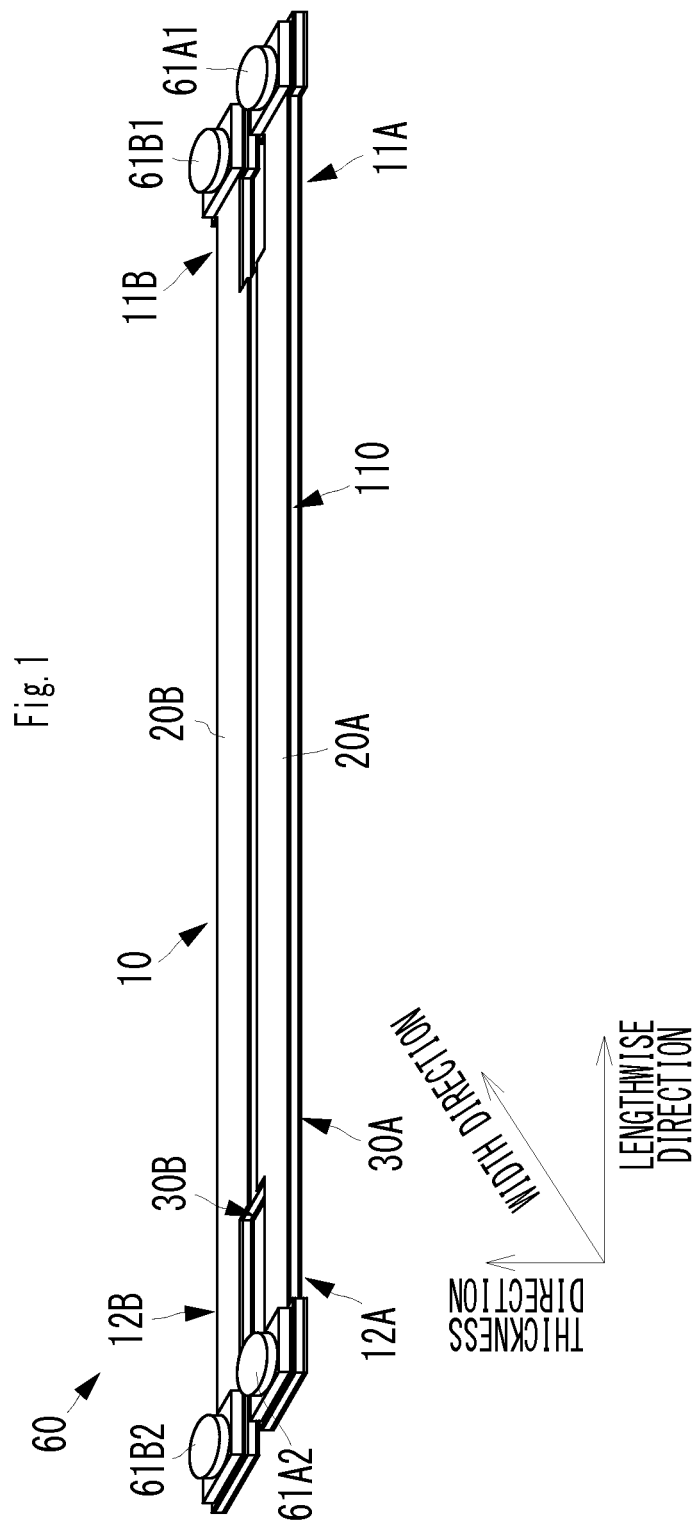

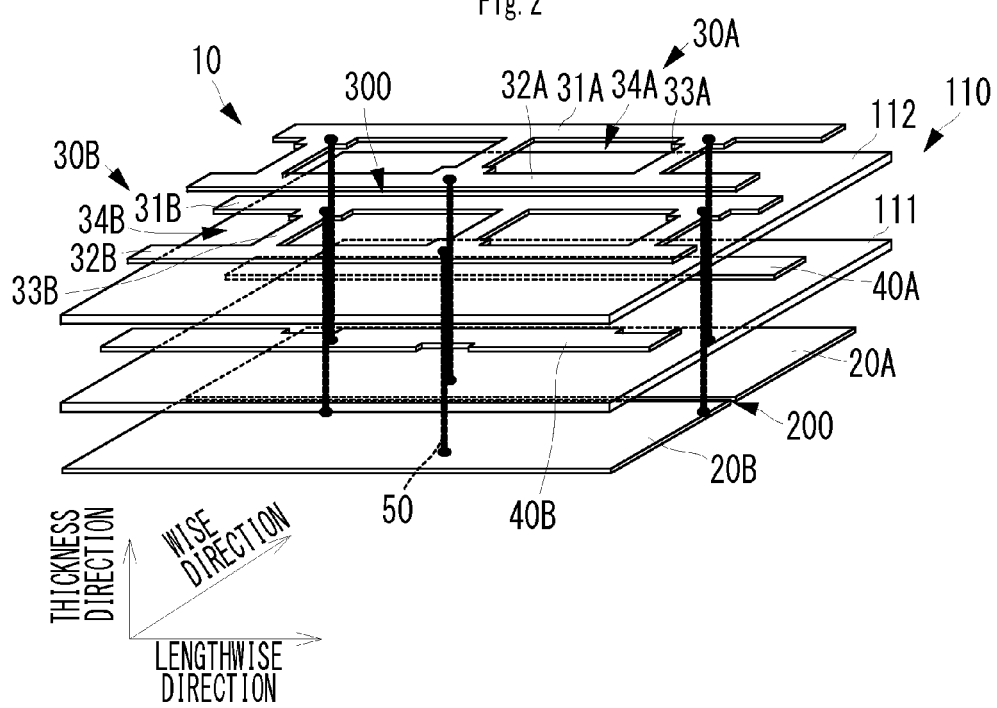

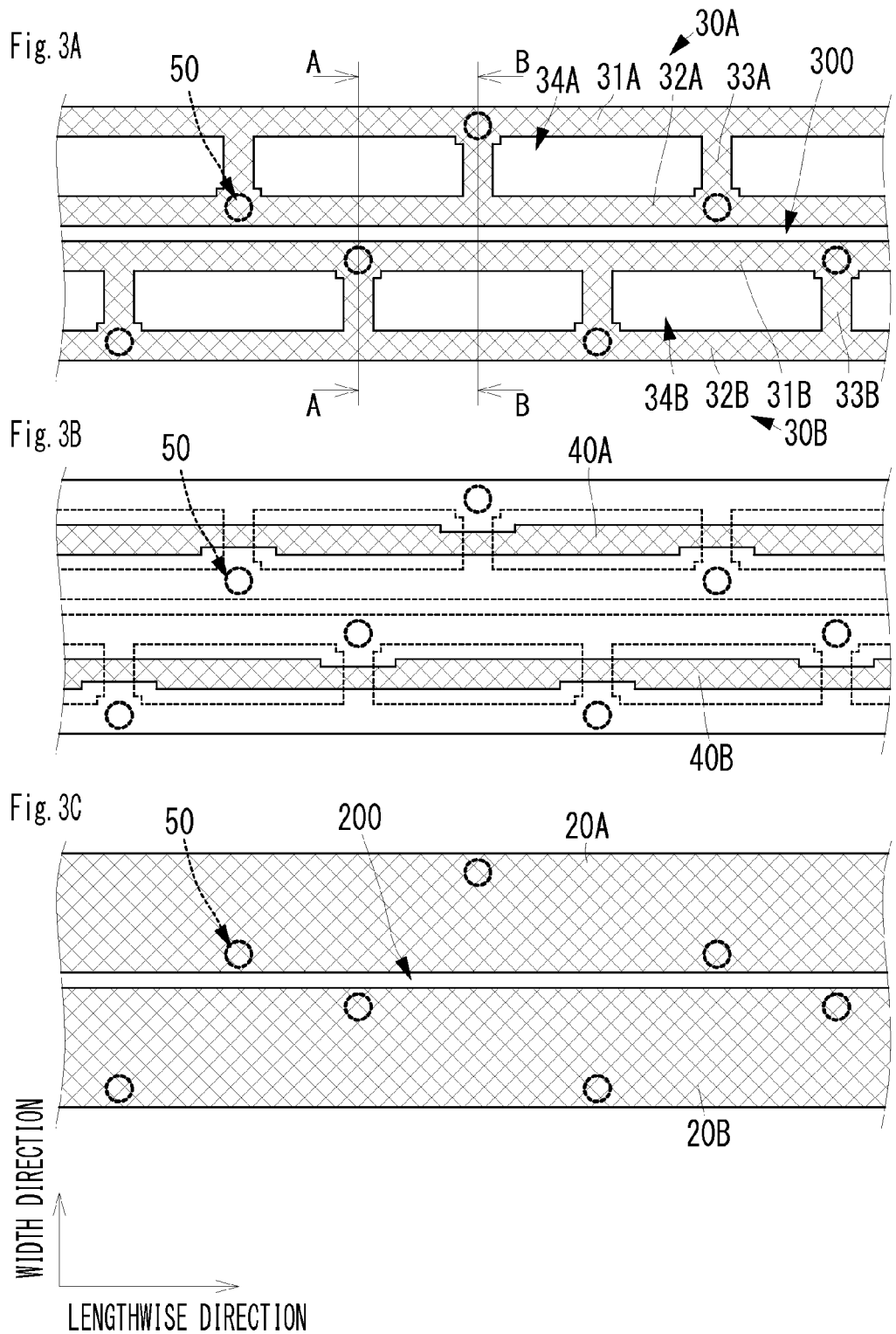

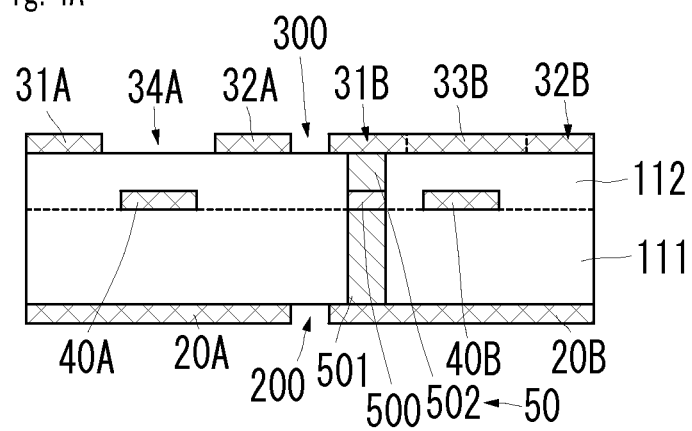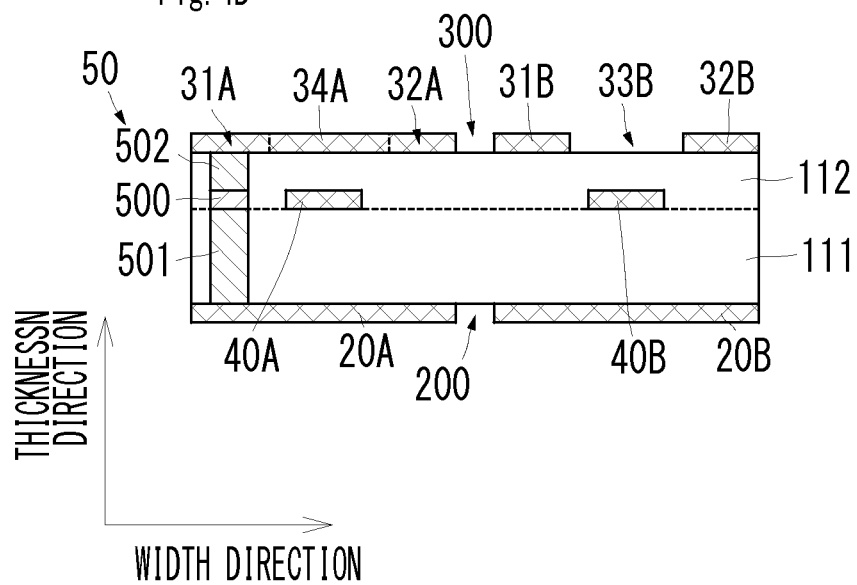

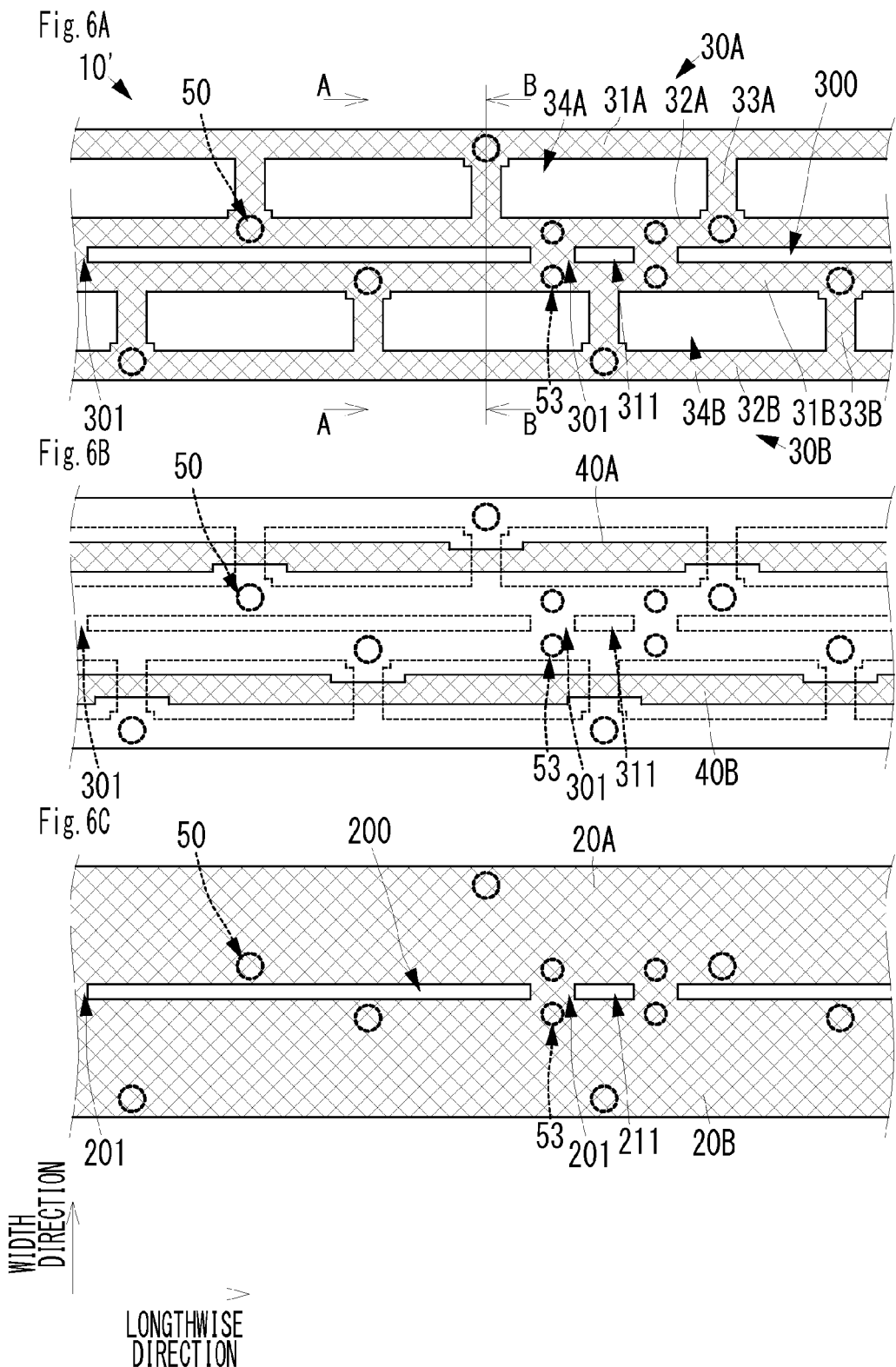

WIDTH DIRECTION
LONGTHWISE DIRECTION

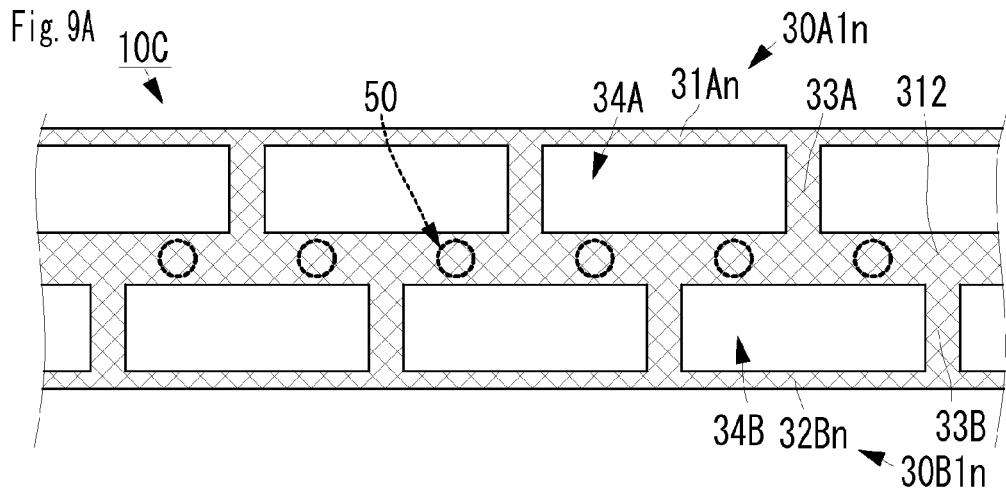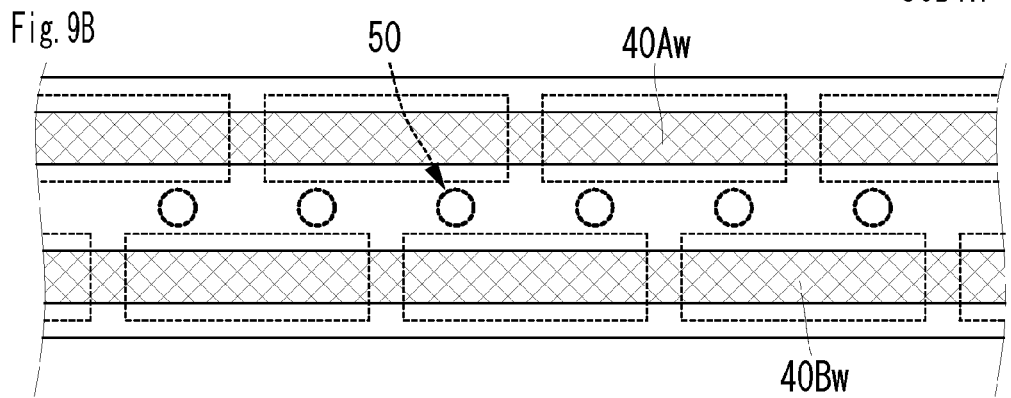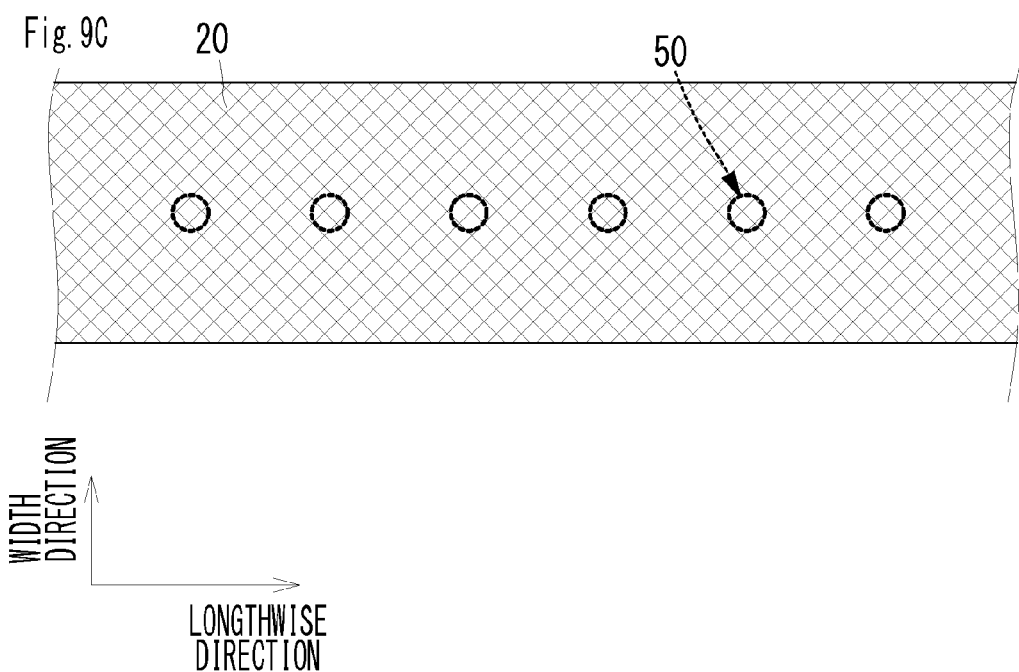

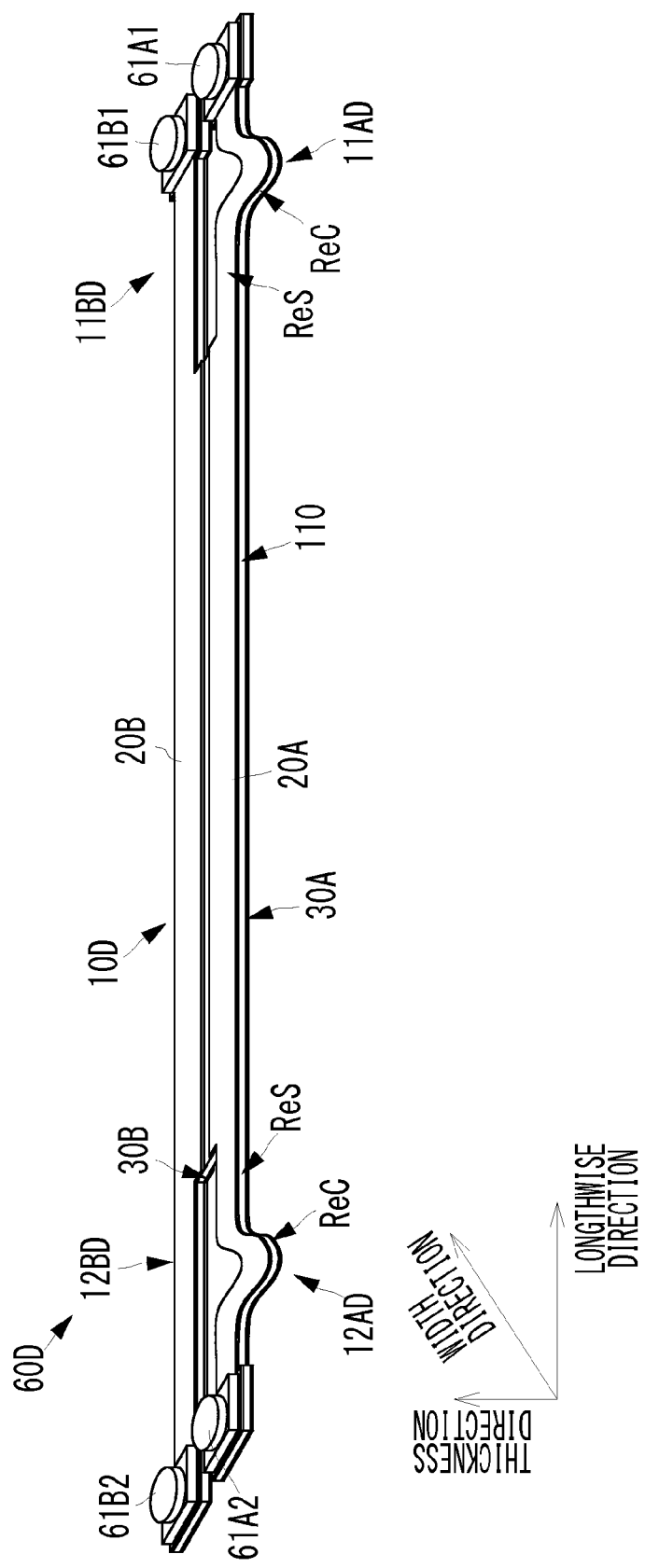

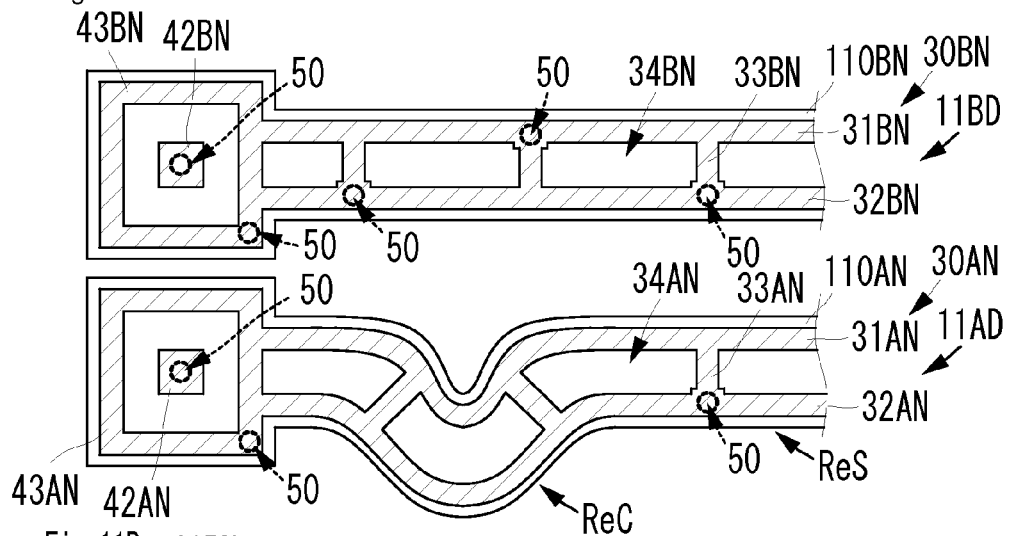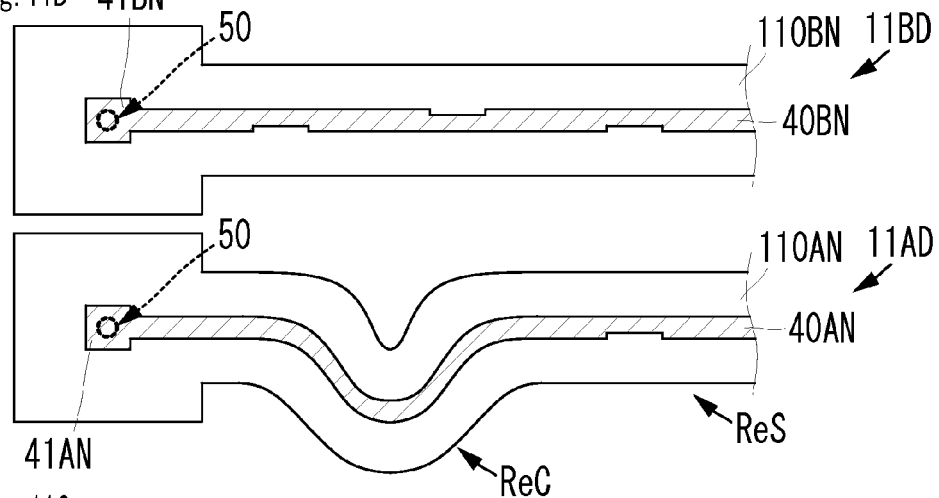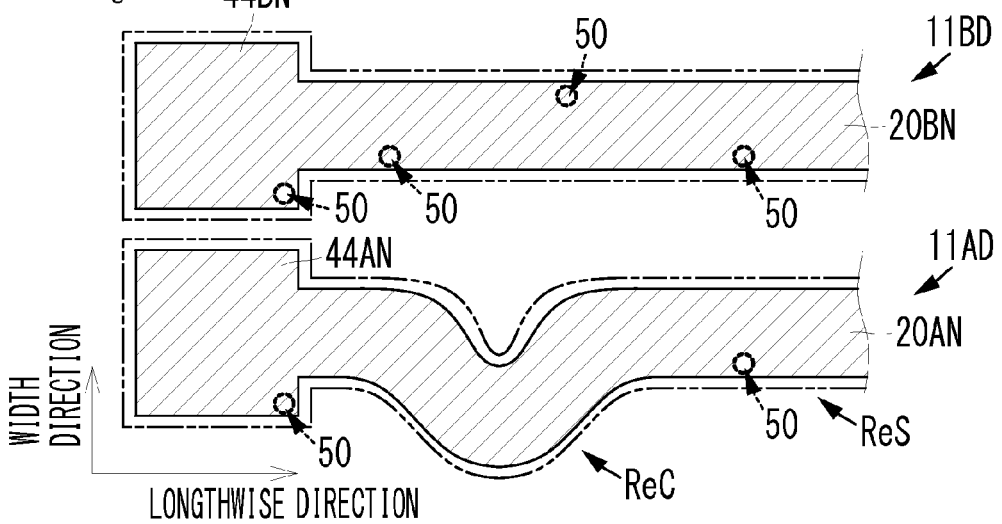

TRANSMISSION LINE, A TRANSMISSION LINE APPARATUS, AND AN ELECTRONIC DEVICE

BACKGROUND OF THE INVENTION

1. Field of the Invention

The present invention relates to a thin transmission line configured to transmit a high-frequency signal and an electronic device including the transmission line.

2. Description of the Related Art

At present it attracts attention to use such a flat cable as illustrated in Japanese Patent No. 4962660 as a high-frequency transmission line for transmitting a high-frequency signal. While the flat cable is larger in width than a coaxial cable, it is possible to make the flat cable thin. Therefore, in particular the flat cable is useful in a case where there is only a thin clearance gap within a terminal housing. In addition, since a dielectric body having flexibility is used as a base material, the flat cable has flexibility and can easily adopt curved or flexed routing.

The flat cable described in Japanese Patent No. 4962660 has a triplate-type strip line structure, as a basic structure.

Such a flat cable as illustrated in Japanese Patent No. 4962660 includes a substantially plate-shaped dielectric body having flexibility and an insulation property. The dielectric body has a substantially elongated shape that extends in a substantially straight line. In one of two surfaces of the dielectric body perpendicular or substantially perpendicular to the thickness direction thereof, a reference ground conductor is arranged. The reference ground conductor is a so-called substantially flat plate-shaped conductor pattern covering nearly the entire surface of the second surface of a base material sheet.

In the other surface facing one of two surfaces of the base material sheet, an auxiliary ground conductor is arranged. The auxiliary ground conductor includes two substantially elongated conductors whose shapes each extend in a longitudinal direction and which are located in two respective end portions thereof in a width direction perpendicular or substantially perpendicular to the longitudinal direction and a thickness direction. The two substantially elongated conductors are connected to each other by bridge conductors each forming a shape that extends in the width direction. The bridge conductors are disposed in the longitudinal direction with predetermined distances therebetween. As a result, the auxiliary ground conductor forms a shape in which an array of opening portions of predetermined opening lengths is formed in the longitudinal direction.

Roughly in the middle portion of the dielectric body in the thickness direction thereof, a signal conductor is formed with a predetermined width and a predetermined thickness. The signal conductor forms a substantially elongated shape that extends in a direction parallel to the substantially elongated conductor portion of the auxiliary ground conductor and the reference ground conductor. The signal conductor is formed roughly in the middle portion of the dielectric body in the width direction thereof.

According to such a configuration, when the flat cable is viewed in plan (viewed from a direction perpendicular or substantially perpendicular to one of two surfaces and the other surface), the signal conductor only overlaps with the bridge conductors of the auxiliary ground conductor and is disposed so that the other regions thereof are located within the opening portions.

However, at present there is required a transmission line capable of transmitting two kinds of high-frequency signals in parallel. In a case where the flat cable described in Japanese Patent No. 4962660, flat cables whose number corresponds to the number of high-frequency signals to be transmitted in parallel are required. Accordingly, it is necessary to arrange and dispose these elements in parallel, and an amount of space is needed.

In addition, in a case where the structures of the transmission lines described in Japanese Patent No. 4962660 are arranged and disposed in parallel in one dielectric body, the positions of the opening portions in a transmission direction coincide with each other between transmission lines adjacent to each other. In this case, positions at which emissions of electric fields or magnetic fields generated by high-frequency signals transmitted through the respective transmission lines are large coincide with each other between the transmission lines adjacent to each other. Accordingly, isolation between the transmission lines adjacent to each other is not secured and crosstalk between the high-frequency signals transmitted through the respective transmission lines turns out to be generated.

If, in particular, transmission lines including flat cables are intended to be downsized, a distance between transmission lines adjacent to each other is decreased, isolation is further reduced, and crosstalk is easily generated.

SUMMARY OF THE INVENTION

Accordingly, preferred embodiments of the present invention provide a small and thin transmission line capable of transmitting a plurality of high-frequency signals in a state in which high isolation between the high-frequency signals is secured.

According to a preferred embodiment of the present invention, a transmission line includes a dielectric body, a signal conductor, a reference ground conductor, an auxiliary ground conductor, and a thickness direction connection conductor. The dielectric body preferably has a substantially plate-shaped configuration and a predetermined thickness. The signal conductor is disposed within the dielectric body and defines a shape which extends in a predetermined transmission direction. The reference ground conductor is disposed in one of two end surfaces of the dielectric body in a thickness direction. The auxiliary ground conductor is disposed in the other end surface of the dielectric body in the thickness direction. The thickness direction connection conductor penetrates the reference ground conductor and the auxiliary ground conductor, thereby connecting the reference ground conductor and the auxiliary ground conductor to each other.

The auxiliary ground conductor includes a first substantially elongated conductor and a second substantially elongated conductor that extending the transmission direction and are disposed with a predetermined distance therebetween in a direction perpendicular or substantially perpendicular to the transmission direction. The auxiliary ground conductor includes bridge conductors that connect, with predetermined distances therebetween in the transmission direction, the first substantially elongated conductor and the second substantially elongated conductor to each other. A plurality of individual transmission portions, which are each based on a set of the reference ground conductor, the auxiliary ground conductor, and the signal conductor, are disposed with respect to the dielectric body, in the direction perpendicular or substantially perpendicular to the transmission direction. Positions of the bridge conductors in the transmission direction in the individual transmission portions adjacent to each other are different.

In this configuration, the positions of the local maximum points of emissions of electric fields and magnetic fields in the transmission direction in the adjacent individual transmission portions are different. Therefore, it is difficult for high-frequency signals transmitted through the respective individual transmission portions to be electromagnetic-field-coupled to each other. As a result, it is possible to secure high isolation between the adjacent individual transmission portions.

In addition, according to a preferred embodiment of the present invention, it is desirable that this transmission line has the following configuration. Positions of the bridge conductors in the transmission direction in one individual transmission portion are located roughly in middle portions between disposition positions of the bridge conductors adjacent to each other in the transmission direction in another individual transmission portion adjacent to the former individual transmission portion.

In this configuration, it is most difficult for the adjacent individual transmission portions to be electromagnetic-field-coupled to each other. As a result, it is possible to secure higher isolation between the adjacent individual transmission portions.

In addition, according to a preferred embodiment of the present invention, it is desirable that this transmission line has the following configuration. The thickness direction conductor is provided at least at each of positions where substantially elongated conductors in the respective adjacent individual transmission portions, which face each other, and the reference ground conductor overlap with each other in the thickness direction.

In this configuration, since the thickness direction conductor is provided between the signal conductors in the adjacent individual transmission portions, it is possible to significantly reduce or prevent electromagnetic field coupling in the direction perpendicular or substantially perpendicular to the transmission direction within the dielectric body.

In addition, in the transmission line according to a preferred embodiment of the present invention, it is desirable that the reference ground conductors in the adjacent individual transmission portions are integrated with each other.

In this configuration, since a conductor non-formation portion configured to separate the reference ground conductors in the adjacent individual transmission portions is omitted, it is possible to reduce the width of the transmission line. Alternatively, even if the width of the transmission line is not increased, it becomes possible for the width of the signal conductor to be designed so as to be wide, and a transmission characteristic is improved.

In addition, in the transmission line according to a preferred embodiment of the present invention, the reference ground conductors in the adjacent individual transmission portions are separated from each other with a predetermined distance therebetween.

In this configuration, it is possible to significantly reduce or prevent crosstalk through the reference ground conductors.

In addition, in the transmission line according to a preferred embodiment of the present invention, the first substantially elongated conductor in one of the individual transmission portions and the second substantially elongated conductor in another one of the individual transmission portions, which are adjacent to each other, are integrated with each other, the two individual transmission portions being adjacent to each other.

In this configuration, since a conductor non-formation portion configured to separate the substantially elongated conductors in the adjacent individual transmission portions is omitted, it is possible to reduce the width of the transmission line. Alternatively, even if the width of the transmission line is not increased, it becomes possible for the width of the signal conductor to be designed so as to be wide, and a transmission characteristic is improved.

In addition, in the transmission line according to a preferred embodiment of the present invention, it is desirable that the thickness direction conductor is provided only at a position where the first substantially elongated conductor and the second substantially elongated conductor, which are integrated with each other, and the reference ground conductor overlap with each other in the thickness direction.

In this configuration, it is possible to reduce the widths of the substantially elongated conductors that do not face each other in the individual transmission portions adjacent to each other. As a result, without changing the width of the transmission line, it is possible to increase the area of an opening portion surrounded by the first and second substantially elongated conductors and the bridge conductors. Accordingly, it is possible to increase the width of the signal conductor and reduce a transmission loss.

In addition, the transmission line according to a preferred embodiment of the present invention may have the following configuration. In the transmission line, a transmission line according to any one of the above-mentioned transmission lines is set as a main transmission line portion, and extending transmission lines connected to two end portions of the main transmission line portion and provided for each of the individual transmission portions are further included. The extending transmission lines connected to one end portion of the main transmission line portion include first and second extending transmission lines. The first extending transmission line extends in a extending direction of the main transmission line portion and has a same conductor configuration as that of the main transmission line portion. The second extending transmission line includes a substantially straight-line portion that extends in the extending direction of the main transmission line portion and has a same conductor configuration as that of the main transmission line portion, and a substantially curved portion that has a shape that is substantially curved in a direction different from the substantially straight-line portion.

In this configuration, since one of the extending transmission line portions connected to one end portion of the main transmission line portion has the degree of freedom for arrangement, it is easy to connect at the time of connecting the transmission line to a circuit mounting substrate.

In addition, it is desirable that the transmission line according to a preferred embodiment of the present invention has a structure in which, in the substantially curved portion in the second extending transmission line, an auxiliary ground conductor, a signal conductor, and a reference ground conductor are disposed in the thickness direction while not being connected to one another.

In this configuration, no thickness direction connection conductor is disposed in the substantially curved portion and the extending property of the substantially curved portion is improved.

In addition, in the transmission line according to a preferred embodiment of the present invention, it is desirable that the reference ground conductors in the adjacent individual transmission portions separated from each other with the distance therebetween are partially connected to each other by a first connection conductor portion.

In addition, in the transmission line according to a preferred embodiment of the present invention, it is desirable that the auxiliary ground conductors separated with respect to the respective individual transmission portions are partially connected to each other by a second connection conductor portion.

In these configurations, it is possible to shift, to a high-frequency side, the frequency of an unnecessary high-frequency signal generated by an air gap located between the individual transmission portions and it is possible to reduce a transmission loss.

In addition, in the transmission line according to a preferred embodiment of the present invention, it is desirable that a non-formation portion of a conductor is provided in at least one of the first connection conductor portion and the second connection conductor portion.

In this configuration, it is possible to improve flexibility.

In addition, in the transmission line according to a preferred embodiment of the present invention, it is desirable that connection conductors that extending the thickness direction are provided in the first connection conductor portion and the second connection conductor portion or at a position at which the first connection conductor portion is connected in the reference ground conductor and a position at which the second connection conductor portion is connected in the auxiliary ground conductor.

In this configuration, it is possible to secure higher isolation between the individual transmission portions.

In addition, in the transmission line according to a preferred embodiment of the present invention, it is desirable that, between the non-formation portion of a conductor provided in at least one of the first connection conductor portion and the second connection conductor portion and the signal conductor when viewed in plan, the thickness direction connection conductor that connects the reference ground conductor and the auxiliary ground conductor to each other is provided.

In this configuration, by providing an opening portion in the first or second connection conductor portion, it is possible to inhibit isolation between individual transmission lines from being reduced.

In addition, other preferred embodiments of the present invention relate to an electronic device and the electronic device preferably includes a transmission line according to any one of the above-mentioned transmission lines, a plurality of circuit elements connected by the transmission line, and a housing in which the circuit elements are embedded.

In this configuration, the electronic device that utilizes one of the above-mentioned transmission lines is illustrated. Using one of the above-mentioned transmission lines, it is possible to secure high isolation between a plurality of transmission lines (individual transmission portions) that perform transmission. Therefore, it is possible to reduce transmission losses in a case where various kinds of high-frequency signals are transmitted between the circuit elements.

According to various preferred embodiments of the present invention, it is possible to provide a small and thin transmission line capable of transmitting a plurality of high-frequency signals in a state in which high isolation between the high-frequency signals is secured.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an external perspective view of a flat cable including a transmission line according to a first preferred embodiment of the present invention.

FIG. 2 is an exploded perspective view illustrating a structure of a main transmission line portion according to the first preferred embodiment of the present invention.

FIGS. 3A to 3C are exploded plan views illustrating the structure of the main transmission line portion according to the first preferred embodiment of the present invention.

FIGS. 4A and 4B are cross-sectional views illustrating the structure of the main transmission line portion according to the first preferred embodiment of the present invention.

FIGS. 6A to 6C are exploded plan views illustrating a structure of a main transmission line according to a second preferred embodiment of the present invention.

FIGS. 9A to 9C are exploded plan views illustrating a structure of a main transmission line portion according to a fifth preferred embodiment of the present invention.

FIG. 10 is an external perspective view of a flat cable including a transmission line according to a sixth preferred embodiment of the present invention.

FIGS. 11A to 11C are exploded plan views illustrating structures of extending transmission lines of the flat cable according to the sixth preferred embodiment of the present invention.

DETAILED DESCRIPTION OF THE PREFERRED EMBODIMENTS

Figure 5A:
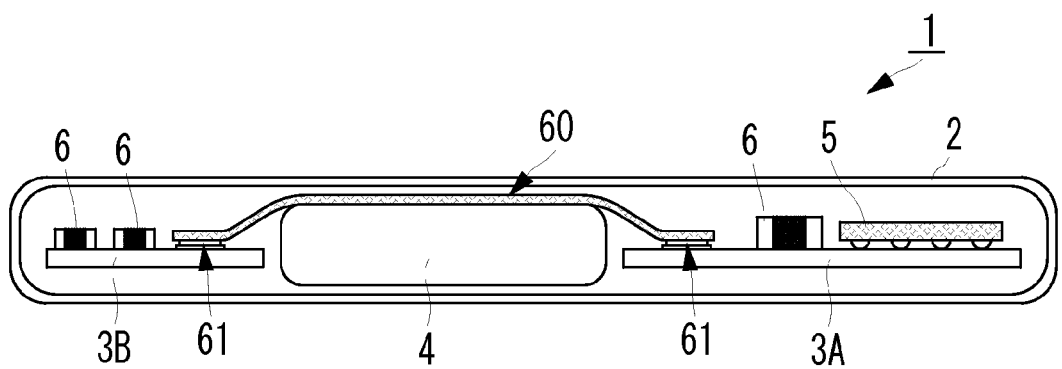
FIGS. 5A and 5B are a side surface cross-sectional view and a plan cross-sectional view illustrating a component configuration of an electronic device according to the first preferred embodiment of the present invention.

A transmission line according to a first preferred embodiment of the present invention will be described with reference to drawings. FIG. 1 is the external perspective view of a flat cable including the transmission line according to the first preferred embodiment of the present invention. FIG. 2 is an exploded perspective view illustrating the structure of a main transmission line portion according to the first preferred embodiment of the present invention. FIGS. 3A to 3C are exploded plan views illustrating the structure of the main transmission line portion according to the first preferred embodiment of the present invention. FIGS. 4A and 4B are cross-sectional views illustrating the structure of the main transmission line portion according to the first preferred embodiment of the present invention. FIG. 4A is a IVA-IVA cross-sectional view illustrated in FIGS. 3A to 3C, and FIG. 4B is a IVB-IVB cross-sectional view illustrated in FIGS. 3A to 3C.

In addition, in FIG. 1, a reference ground conductor side on which connectors are arranged is described as a top surface, and in and after FIG. 2, an auxiliary ground conductor side on which no connector is arranged is described as a top surface.

A flat cable 60 includes a main transmission line 10, extending transmission lines 11A, 11B, 12A, and 12B, and connectors 61A1, 61A2, 61B1, and 61B2. The main transmission line 10 preferably has a substantially plate-shaped and substantially elongated configuration. The lengthwise direction thereof is the longitudinal direction of the main transmission line 10 and corresponds to the transmission direction of a high-frequency signal. In addition, a direction parallel or substantially parallel to a plate surface and perpendicular or substantially perpendicular to the lengthwise direction (in other words, the transmission direction) is a width direction. The main transmission line 10 corresponds to a "transmission line" and a "main line portion" of a preferred embodiment of the present invention.

As illustrated in FIG. 2, the main transmission line 10 includes a dielectric body 110, reference ground conductors 20A and 20B, auxiliary ground conductors 30A and 30B, and signal conductors 40A and 40B.

The dielectric body 110 includes a first dielectric layer 111 and a second dielectric layer 112. The dielectric body 110 is a substantially flexible plate having a predetermined thickness. The dielectric body 110 preferably has a substantially elongated shape and is preferably made of a material having flexibility, such as, for example, polyimide or liquid crystal polymer. In addition, each of the first dielectric layer 111 and the second dielectric layer 112 may be a dielectric layer in which a plurality of dielectric layers are stacked.

The reference ground conductors 20A and 20B are disposed in one of two end surfaces (plate surfaces) of the dielectric body 110, in other words, the exposed surface of the first dielectric layer 111. Each of the reference ground conductors 20A and 20B is a substantially elongated and flat plate-shaped conductor and preferably has a shape that extends in substantially the same direction as the lengthwise direction of the dielectric body 110. The reference ground conductors 20A and 20B are disposed with an air gap 200 therebetween in the width direction. The reference ground conductors 20A and 20B are made of a material whose conductivity is high, for example, copper (Cu) or the like. The reference ground conductors 20A and 20B are ground conductors that mainly determine the characteristic impedances of the main transmission line 10, the extending transmission lines 11A, 11B, 12A, and 12B. The characteristic impedance of the main transmission line 10 preferably is designed so as to be, for example, about 55Ω slightly higher than about 50Ω, based on the signal conductors 40A and 40B and the reference ground conductors 20A and 20B. In addition, the shapes of the auxiliary ground conductors 30A and 30B are adjusted so that the characteristic impedance of the main transmission line 10 becomes about 50Ω, based on the signal conductors 40A and 40B, the reference ground conductors 20A and 20B, and the auxiliary ground conductors 30A and 30B to be described later.

The auxiliary ground conductors 30A and 30B are provided in the other end surface (plate surface) of the dielectric body 110, in other words, the exposed surface of the second dielectric layer 112. Each of the auxiliary ground conductors 30A and 30B preferably is a substantially elongated and flat plate-shaped conductor and preferably has a shape that extends in substantially the same direction as the lengthwise direction of the dielectric body 110. The auxiliary ground conductors 30A and 30B are disposed with an air gap 300 therebetween in the width direction. The auxiliary ground conductor 30A faces the reference ground conductor 20A through the dielectric body 110. The auxiliary ground conductor 30B faces the reference ground conductor 20B through the dielectric body 110. The auxiliary ground conductors 30A and 30B are made of a material whose conductivity is high, for example, copper (Cu) or the like.

The auxiliary ground conductor 30A includes substantially elongated conductors 31A and 32A and bridge conductors 33A. The substantially elongated conductors 31A and 32A each have a substantially elongated shape that extends in the longitudinal direction of the dielectric body 110. The substantially elongated conductors 31A and 32A are configured with a predetermined distance therebetween in the width direction of the dielectric body 110.

The bridge conductors 33A each preferably have a shape that substantially extends in the width direction of the dielectric body 110. The plural bridge conductors 33A are configured with distances therebetween in the longitudinal direction of the dielectric body 110. As a result, when viewed from a direction perpendicular or substantially perpendicular to the plate surface (viewed in a thickness direction), opening portions 34A are provided between the bridge conductors 33A.

In this way, the auxiliary ground conductor 30A defines a substantially ladder shape that extends in the longitudinal direction.

The auxiliary ground conductor 30B includes substantially elongated conductors 31B and 32B and bridge conductors 33B. The substantially elongated conductors 31B and 32B each have a substantially elongated shape that extends in the longitudinal direction of the dielectric body 110. The substantially elongated conductors 31B and 32B are configured with a predetermined distance therebetween in the width direction of the dielectric body 110.

The bridge conductors 33B each preferably have a shape that substantially extends in the width direction of the dielectric body 110. The plural bridge conductors 33B are provided with distances therebetween in the longitudinal direction of the dielectric body 110. As a result, when viewed from a direction perpendicular or substantially perpendicular to the plate surface (viewed in the thickness direction), opening portions 34B are provided between the bridge conductors 33B.

In this way, the auxiliary ground conductor 30B preferably has a substantially ladder-shaped configuration that extends in the longitudinal direction.

In addition, distances between the bridge conductors 33A and 33B of the respective auxiliary ground conductors 30A and 30B in the transmission direction are designed so as to generate no radiation noise within a used band.

The auxiliary ground conductors 30A and 30B are ground conductors that define and function as shields. In addition, as described above, the auxiliary ground conductors 30A and 30B are disposed in order to perform final adjustment so that the characteristic impedance of the main transmission line 10 becomes, for example, about 50 Ω.

The auxiliary ground conductor 30A is connected to the reference ground conductor 20A through thickness direction connection conductors 50 that penetrate the dielectric body 110 in the thickness direction. The auxiliary ground conductor 30B is connected to the reference ground conductor 20B through thickness direction connection conductors 50 that penetrate in the thickness direction. The thickness direction connection conductors 50 are provided in a plurality of points.

More specifically, as illustrated in FIGS. 4A and 4B, the thickness direction connection conductors 50 each include an intermediate conductor pattern 500 and via conductors 501 and 502. The intermediate conductor pattern 500 is provided in a boundary surface between the first dielectric layer 111 and the second dielectric layer 112. The via conductor 501 preferably has a shape that penetrates the first dielectric layer 111. The via conductor 502 preferably has a shape that penetrates the second dielectric layer 112.

The thickness direction connection conductors 50 are provided at the points of intersection between the bridge conductors and the substantially elongated conductors of each of the auxiliary ground conductors 30A and 30B. In addition, the thickness direction connection conductors 50 each have a given diameter. Accordingly, portions of the auxiliary ground conductors 30A and 30B, in which the thickness direction connection conductors 50 are provided, protrude in the width direction (opening direction) so as to correspond to these. In addition, the signal conductors 40A and 40B each have cutouts so as to be narrowed in the width direction, the cutouts corresponding to the thickness direction connection conductors 50 or the protrusions of the auxiliary ground conductors 30A and 30B. The characteristic impedance of the main transmission line 10 is designed in view of this point.

In addition, the thickness direction connection conductors 50 are alternately provided in the unit of one thickness direction connection conductor 50 in the width direction, at the points of intersection between the bridge conductors and the substantially elongated conductors of each of the auxiliary ground conductors 30A and 30B. In a case where it is assumed that two of the thickness direction connection conductors 50 are provided in a width direction, the signal conductors 40A and 40B are each forced to be designed so as to be narrow in the width direction in portions that overlap with the bridge conductors. As a result, there is a possibility that the transmission characteristics of the signal conductors 40A and 40B are deteriorated. In order to avoid this, the main transmission line 10 is forced to become wide. In the present preferred embodiment, preferably only one thickness direction connection conductor 50 is to be provided in a width direction, for example. Therefore, it is possible to inhibit the widths of the signal conductors 40A and 40B from becoming narrow and furthermore it is not necessary to widen the width of the main transmission line 10.

In addition, the thickness direction connection conductors 50 are alternately provided in the unit of one thickness direction connection conductor 50 in the width direction, at the points of intersection between the bridge conductors and the substantially elongated conductors of each of the auxiliary ground conductors 30A and 30B. Therefore, it is possible to secure isolation with an external circuit while securing isolation between individual transmission portions adjacent to each other. Furthermore, it is possible to keep a good balance between the ground potentials of the auxiliary ground conductors 30A and 30B.

The signal conductors 40A and 40B each preferably have a substantially flat film-shape and are provided in an interlayer between the first dielectric layer 111 and the second dielectric layer 112. The signal conductors 40A and 40B are disposed with a predetermined distance therebetween in the width direction of the dielectric body 110. The signal conductors 40A and 40B are made of a material whose conductivity is high, for example, copper (Cu) or the like.

The signal conductor 40A is disposed so as to face the reference ground conductor 20A through the first dielectric layer 111 and face the auxiliary ground conductor 30A through the second dielectric layer 112. The signal conductor 40A is located roughly in the middle portion of the reference ground conductor 20A in the width direction and disposed roughly in the middle portions of the opening portions 34A of the auxiliary ground conductor 30A in the width direction.

The signal conductor 40B is disposed so as to face the reference ground conductor 20B through the first dielectric layer 111 and face the auxiliary ground conductor 30B through the second dielectric layer 112. The signal conductor 40B is located roughly in the middle portion of the reference ground conductor 20B in the width direction and disposed roughly in the middle portions of the opening portions 34B of the auxiliary ground conductor 30B in the width direction.

Based on such a configuration as described above, the main transmission line 10 preferably has a structure in which the single dielectric body 110 is used as a base and a first main line and a second main line are disposed with leaving a space therebetween in the width direction. The first main line includes the reference ground conductor 20A, the auxiliary ground conductor 30A, the signal conductor 40A, and the dielectric body 110. The second main line includes the reference ground conductor 20B, the auxiliary ground conductor 30B, the signal conductor 40B, and the dielectric body 110.

In addition, in the main transmission line 10 of the present preferred embodiment, the disposition positions of the bridge conductors 33A of the first main line and the disposition positions of the bridge conductors 33B of the second main line are different from each other in the longitudinal direction. More specifically, the bridge conductors 33A of the first main line are disposed so as to be located roughly in respective middle positions between the bridge conductors 33B adjacent to each other in the second main line.

The middle positions between the bridge conductors adjacent to each other are portions whose distances from the bridge conductors are maximized, and at the middle positions, electric field strengths and magnetic field strengths, based on a high-frequency signal, become the largest.

By adopting such a configuration, the maximum points of the electric field strengths and the maximum points of the magnetic field strengths, based on a high-frequency signal transmitted through the first main line, and the maximum points of the electric field strengths and the maximum points of the magnetic field strengths, based on a high-frequency signal transmitted through the second main line, do not line up with each other in the longitudinal direction. As a result, it is possible to secure high isolation between the first main line and the second main line, and it is possible to significantly reduce or prevent crosstalk between the high-frequency signal transmitted through the first main line and the high-frequency signal transmitted through the second main line. The reason is that the electric field distributions and the magnetic field distributions of the high-frequency signals transmitted through the first and second main lines depend on the positions and the patterns of the bridge conductors 33A and 33B.

In addition, since the single dielectric body 110 is used by applying the present preferred embodiment, it is possible to form in a small size, compared with a case where the dielectric body 110 is used for each high-frequency signal. In addition, using the substantially plate-shaped dielectric body 110, it is possible to provide a thinner transmission line than a coaxial cable.

In addition, as illustrated in the present preferred embodiment, by disposing the reference ground conductors 20A and 20B with the air gap 200 therebetween in the width direction, it is possible to inhibit the first main line and the second main line from being coupled to each other through a ground. As a result, it is possible to secure higher isolation between the first main line and the second main line.

In addition, while, from the point of view of isolation, it is desirable that, as a positional relationship between the bridge conductors 33A and 33B, each other's middle positions in the longitudinal direction are adopted as in the present preferred embodiment, it is only necessary for positions in the longitudinal direction to be different from one another.

In addition, it is desirable that the thickness direction connection conductors 50 are provided at least at positions where the substantially elongated conductors 32A and 31B, located on sides on which the first main line and the second main line are close to each other, face the reference ground conductors 20A and 20B, respectively. As a result, within the dielectric layer 111, the first main line and the second main line are isolated from each other by the thickness direction connection conductors 50 connected to a ground potential. Therefore, it is possible to inhibit the first main line and the second main line from being electromagnetic-field-coupled to each other within the dielectric layer 111.

Returning to FIG. 1, the extending transmission lines 11A and 11B are connected to one of two end portions of the main transmission line 10 in the longitudinal direction. The extending transmission lines 11A and 11B are disposed with a predetermined distance therebetween in the width direction. The extending transmission lines 12A and 12B are connected to the other end portion of the main transmission line 10 in the longitudinal direction. The extending transmission lines 12A and 12B are disposed with a predetermined distance therebetween in the width direction.

The extending transmission lines 11A and 12A are disposed at both end portions in the longitudinal direction with the main transmission line 10 sandwiched therebetween. The extending transmission lines 11B and 12B are disposed at both end portions in the longitudinal direction with the main transmission line 10 sandwiched therebetween. The extending transmission lines 11A and 11B are connected to the first main line of the main transmission line 10, and the extending transmission lines 12A and 12B are connected to the second main line of the main transmission line 10.

Specifically, the extending transmission lines 11A, 11B, 12A, and 12B define the following structure. In the same way as the first main line and the second main line, the extending transmission lines 11A, 11B, 12A, and 12B each define a structure where a dielectric body in which a signal conductor is disposed at a predetermined position in the thickness direction is sandwiched between a reference ground conductor and an auxiliary ground conductor.

The signal conductors of the extending transmission lines 11A and 12A are connected to the signal conductor 40A of the main transmission line 10. The reference ground conductors of the extending transmission lines 11A and 12A are connected to the reference ground conductor 20A of the main transmission line 10. The auxiliary ground conductors of the extending transmission lines 11A and 12A are connected to the auxiliary ground conductor 30A of the main transmission line 10. The functions of the reference ground conductors and the auxiliary ground conductors are the same as those described above.

The signal conductors of the extending transmission lines 11B and 12B are connected to the signal conductor 40B of the main transmission line 10. The reference ground conductors of the extending transmission lines 11B and 12B are connected to the reference ground conductor 20B of the main transmission line 10. The auxiliary ground conductors of the extending transmission lines 11B and 12B are connected to the auxiliary ground conductor 30B of the main transmission line 10.

In addition, while the widths of the first main line and the second main line are different from the widths of the extending transmission lines 11A, 11B, 12A, and 12B, it is preferable to adopt a structure such that distances (lengths in the width direction) between the substantially elongated conductors of the auxiliary ground conductors are gradually changed at positions at which the widths of the first main line and the second main line are connected to the respective extending transmission lines 11A, 12A, 11B, and 12B. As a result, it is possible to significantly reduce or prevent transmission losses between the widths of the first main line and the second main line and the respective extending transmission lines 11A, 12A, 11B, and 12B.

The connector 61A1 is disposed in an end portion of the extending transmission line 11A (an end portion on a side opposite to the main transmission line 10). The connector 61A2 is disposed in an end portion of the extending transmission line 12A (an end portion on a side opposite to the main transmission line 10). The connector 61B1 is disposed in an end portion of the extending transmission line 11B (an end portion on a side opposite to the main transmission line 10). The connector 61B2 is disposed in an end portion of the extending transmission line 12B (an end portion on a side opposite to the main transmission line 10).

The connectors 61A1 and 61B1 are disposed on one of two end portion sides of the main transmission line 10, and the connectors 61A2 and 61B2 are disposed on the other end portion side of the main transmission line 10. The connector 61A1 is electrically connected to the extending transmission line 11A, and the connector 61A2 is electrically connected to the extending transmission line 12A. The connector 61B1 is electrically connected to the extending transmission line 11B, and the connector 61B2 is electrically connected to the extending transmission line 12B. As the connectors 61A1, 61A2, 61B1, and 61B2, it is possible to use, for example, coaxial type connectors.

In addition, in two plate surfaces of the flat cable 60, protective films not illustrated may be provided.

As described above, if the configuration of the present preferred embodiment is used, it is possible to provide a small and thin flat cable capable of transmitting a plurality of high-frequency signals in a state in which high isolation between the high-frequency signals is secured.

The flat cable 60 having such a structure is manufactured as illustrated as, for example, follows. In addition, while the structure of the main transmission line 10 will be illustrated in the following description, the extending transmission lines 11A, 11B, 12A, and 12B are integrated with the main transmission line 10.

In a first step, first, second, and third one-side copper-clad insulating films, in each of which a copper foil is clad in an entire surface on one of two sides, are prepared. As the insulating films, liquid crystal polymer is preferably used in the present preferred embodiment, for example.

In one of two end surfaces of the first insulating film, the reference ground conductors 20A and 20B are formed using patterning processing. In another end surface of two end surfaces of the second insulating film, the signal conductors 40A and 40B are formed using patterning processing. In another end surface of two end surfaces of the third insulating film, the auxiliary ground conductors 30A and 30B are formed using patterning processing. In addition, in each of the first, second, and third insulating films, the thickness direction connection conductors 50 are formed so as to connect the reference ground conductor 20A and the auxiliary ground conductor 30A to each other and connect the reference ground conductor 20B and the auxiliary ground conductor 30B to each other. Specifically, a surface side of each of the first, second, and third insulating films, on which no copper foil is clad, is irradiated with a laser beam, thus forming through holes, and it is possible to form the thickness direction connection conductors 50 by filling the through holes with a conductive paste.

In addition, the first, second, and third insulating films are stuck together so that the reference ground conductor 20A and the auxiliary ground conductor 30A face each other with the signal conductor 40A sandwiched therebetween and the reference ground conductor 20B and the auxiliary ground conductor 30B face each other with the signal conductor 40B sandwiched therebetween, and the dielectric body 110 is provided.

In addition, the connectors 61A1, 61B1, 61A2, and 61B2 are placed in the respective extending transmission lines 11A, 11B, 12A, and 12B disposed in both the end portions of the flat cable 60 in the longitudinal direction.

Figure 5B:
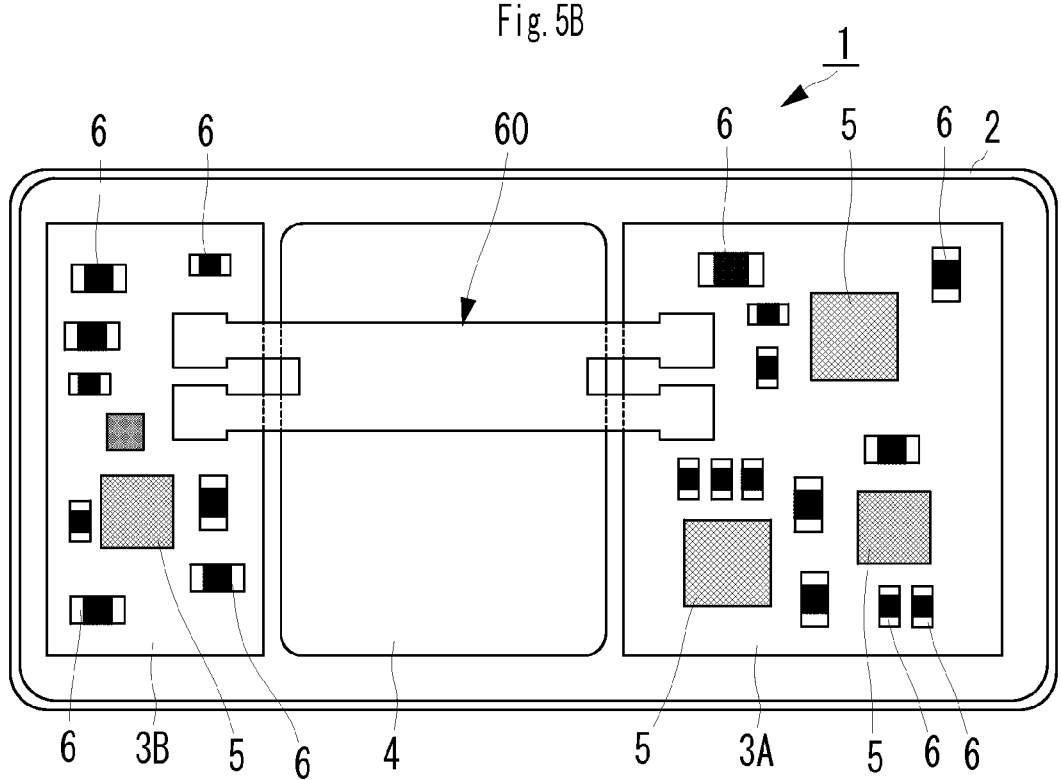

It is possible to use the flat cable 60, which defines the above-mentioned structure, for a portable electronic device illustrated in the following. FIG. 5A is a side surface cross-sectional view illustrating the component configuration of a portable electronic device according to the first preferred embodiment of the present invention, and FIG. 5B is a plan cross-sectional view explaining the component configuration of the relevant portable electronic device.

A portable electronic device 1 includes a thin device housing 2. Within the device housing 2, circuit mounting substrates 3A and 3B defining and serving as circuit elements and a battery pack 4 are disposed. In the surfaces of the circuit mounting substrates 3A and 3B, IC chips 5 and mounted components 6 are mounted. The circuit mounting substrates 3A and 3B and the battery pack 4 are installed in the device housing 2 so that the battery pack 4 is disposed between the circuit mounting substrates 3A and 3B when the device housing 2 is viewed in plan. Here, since the device housing 2 is formed so as to become as thin as possible, a distance between the battery pack 4 and the device housing 2 is extremely small in the thickness direction of the device housing 2. Accordingly, it is difficult to dispose a coaxial cable therebetween.

However, by disposing the flat cable 60 illustrated in the present preferred embodiment so that the thickness direction of the relevant flat cable 60 and the thickness direction of the device housing 2 coincide with each other, it is possible to put the flat cable 60 between the battery pack 4 and the device housing 2. As a result, using the flat cable 60, it is possible to connect the circuit mounting substrates 3A and 3B to each other, the circuit mounting substrates 3A and 3B being spaced apart from each other with the battery pack 4 disposed therebetween.

Furthermore, even in a case where the connecting positions of the flat cable 60 with the circuit mounting substrates 3A and 3B and the installation surface of the flat cable 60 with the battery pack 4 are different from each other in the thickness direction of the device housing 2 and it is necessary to curve and connect the flat cable 60, it is possible to significantly reduce or prevent a transmission loss and transmit a high-frequency signal, using the structure of the present preferred embodiment.

Furthermore, since, using the flat cable 60, it is possible to transmit a plurality of high-frequency signals in proximity to one another, it is possible to reduce a region configured to transmit the plural high-frequency signals and it is possible to save space. At this time, it is possible to transmit each high-frequency signal while reducing the transmission loss thereof.

Next, a transmission line according to a second preferred embodiment of the present invention will be described with reference to drawings. FIGS. 6A to 6C are exploded plan views illustrating the structure of a main transmission line according to the second preferred embodiment of the present invention.

A main transmission line 10' of the present preferred embodiment is different from the main transmission line 10 according to the first preferred embodiment in the structures of reference ground conductors and auxiliary ground conductors, and the other configuration is the same. Accordingly, only points different from the main transmission line 10 according to the first preferred embodiment will be specifically described.

The reference ground conductors 20A and 20B are connected to each other by connection conductor portions 201. The connection conductor portions 201 correspond to a "first connection conductor portion" of a preferred embodiment of the present invention. The connection conductor portions 201 are partially provided at predetermined positions in the longitudinal directions of the reference ground conductors 20A and 20B (the transmission direction of a high-frequency signal to be transmitted). In other words, the connection conductor portions 201 are configured so as to partially fill the air gap 200. It is only necessary for at least one of the connection conductor portions 201 to be provided. In this way, a configuration in which the reference ground conductors 20A and 20B are partially connected to each other by the connection conductor portions 201 is provided. Therefore, it is possible to shift, to a high-frequency side, the resonant frequency of an unnecessary high-frequency signal generated by providing the air gap 200 while securing flexibility based on the air gap 200 not filled by the connection conductor portions 201. As a result, it is possible to reduce a transmission loss.

The auxiliary ground conductors 30A and 30B are connected to each other by connection conductor portions 301. The connection conductor portions 301 correspond to a "second connection conductor portion" of a preferred embodiment of the present invention. The connection conductor portions 301 are partially provided at predetermined positions in the longitudinal directions of the auxiliary ground conductors 30A and 30B. In other words, the connection conductor portions 301 are formed so as to partially fill the air gap 300. It is only necessary for at least one of the connection conductor portions 301 to be provided. In this way, a configuration in which the auxiliary ground conductors 30A and 30B are partially connected to each other by the connection conductor portions 301 is provided. Therefore, it is possible to shift, to a high-frequency side, the resonant frequency of an unnecessary high-frequency signal generated by providing the air gap 300 while securing flexibility based on the air gap 300 not filled by the connection conductor portions 301. As a result, it is possible to reduce a transmission loss.

Furthermore, as illustrated in FIGS. 6A to 6C, it is preferable that the connection conductor portions 201 and the connection conductor portions 301 are caused to overlap with each other when the main transmission line 10 is viewed in plan and thickness direction connection conductors 53 are provided at positions in the longitudinal direction of the main transmission line 10, at which the connection conductor portions 201 and 301 are provided. The thickness direction connection conductors 53 connect the respective connection conductor portions 201 and 301 to each other. Alternatively, the thickness direction connection conductors 53 connect portions of the reference ground conductor 20A, located at positions to which the connection conductor portions 201 connect and in the vicinities thereof, and portions of the auxiliary ground conductor 30A, located at positions to which the connection conductor portions 301 connect and in the vicinities thereof, to one another or connect portions of the reference ground conductor 20B, located at positions to which the connection conductor portions 201 connect and in the vicinities thereof, and portions of the auxiliary ground conductor 30B, located at positions to which the connection conductor portions 301 connect and in the vicinities thereof, to one another.

At this time, it is more desirable that the thickness direction connection conductors 53 whose number is two or more are provided at each of different positions in the longitudinal direction.

In this way, by providing the thickness direction connection conductors 53, it is possible to secure isolation between the first main line and the second main line.

Furthermore, as illustrated in FIGS. 6A to 6C, it is desirable that opening portions 211 are provided in the respective connection conductor portions 201, and it is desirable that opening portions 311 are provided in the respective connection conductor portions 301. These opening portions 211 and 311 are so-called non-formation portions of conductors in the connection conductor portions 201 and 301. Using such a configuration, it is possible to mitigate reduction in flexibility, due to the connection conductor portions 201 and 301. Furthermore, by providing the opening portions 311 in the connection conductor portions 301, it is possible to weaken magnetic field coupling between the first main line and the second main line through the opening portions 34A and 34B provided in the auxiliary ground conductors 30A and 30B.

In addition, while not illustrated, it is desirable that the thickness direction connection conductors 53 are provided in regions sandwiched between the opening portions 211 and 311 and the signal conductors 40A and 40B. As a result, even if standing waves based on the opening portions 211 and 311 are generated, it is possible to inhibit noises due to the standing waves from propagating to the signal conductors 40A and 40B.

In addition, it is only necessary for at least one of the connection conductor portions 201 and 301 to be provided.

Figure 7A:
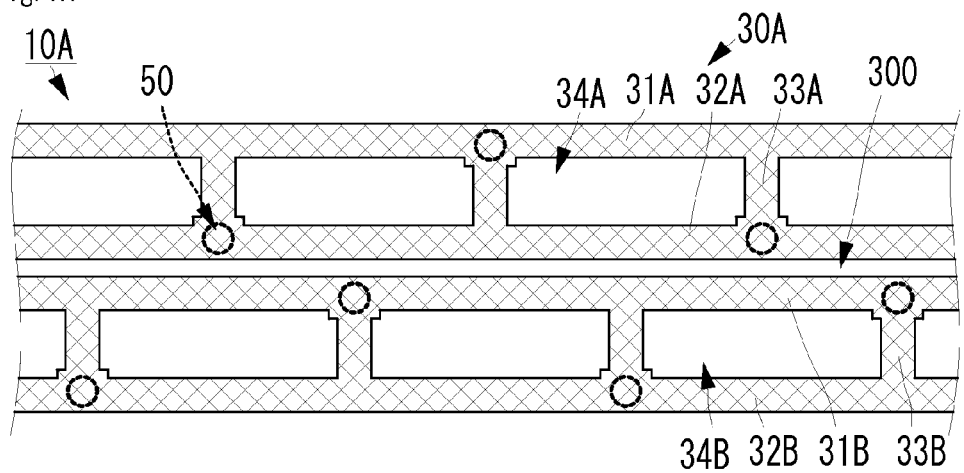
FIGS. 7A to 7C are exploded plan views illustrating a structure of a main transmission line portion according to a third preferred embodiment of the present invention.
Figure 7B:
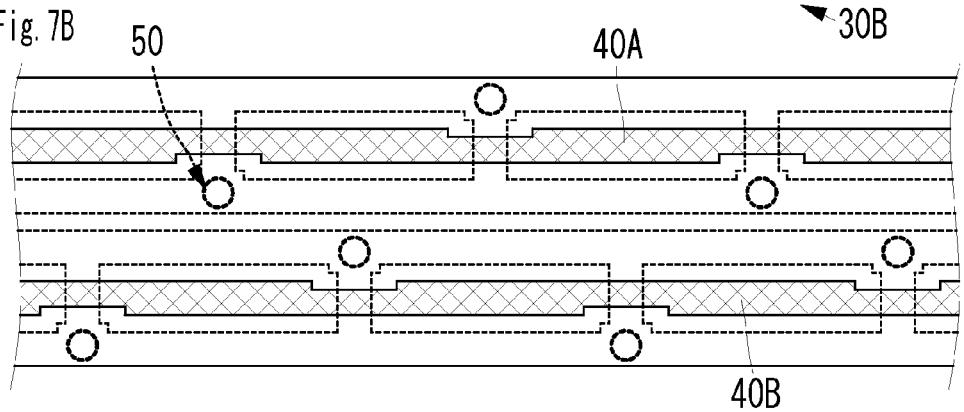
Figure 7C:
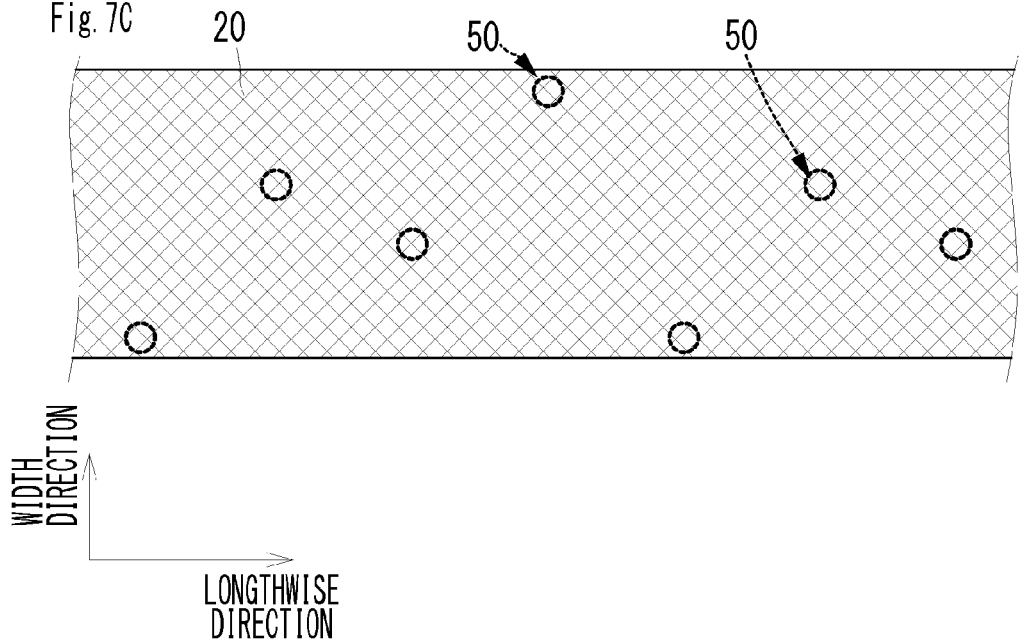

Next, a transmission line according to a third preferred embodiment of the present invention will be described with reference to drawings. FIGS. 7A to 7C are exploded plan views illustrating the structure of a main transmission line according to the third preferred embodiment of the present invention.

A main transmission line 10A of the present preferred embodiment is different from the main transmission line 10 according to the first preferred embodiment in the structure of a reference ground conductor, and the other configuration is the same. Accordingly, only points different from the main transmission line 10 according to the first preferred embodiment will be specifically described.

The main transmission line 10A includes a reference ground conductor 20. The reference ground conductors 20A and 20B illustrated in the first preferred embodiment are integrated with each other, thus defining the reference ground conductor 20. Even in such a configuration, it is possible to obtain the same function effect as that of the first preferred embodiment. Furthermore, in the configuration of the present preferred embodiment, since it is not necessary to provide the air gap 200, the reference ground conductor is easily formed.

Figure 8A:
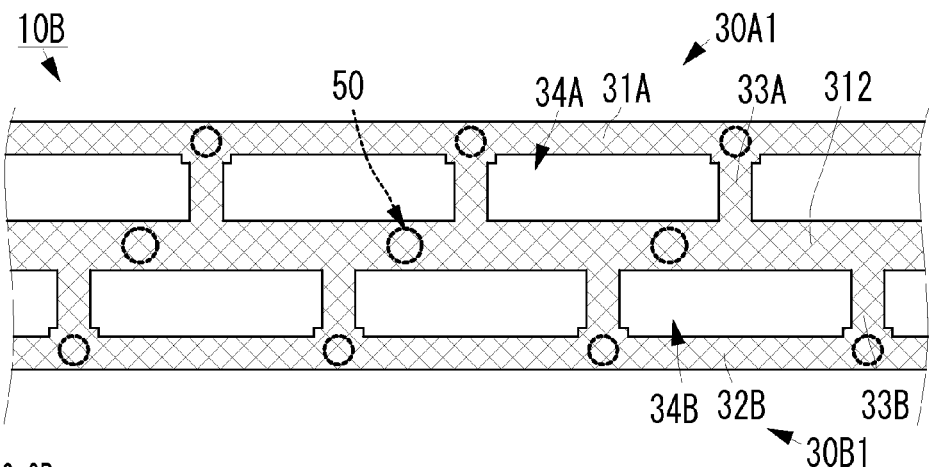
FIGS. 8A to 8C are exploded plan views illustrating a structure of a main transmission line portion according to a fourth preferred embodiment of the present invention.
Figure 8B:
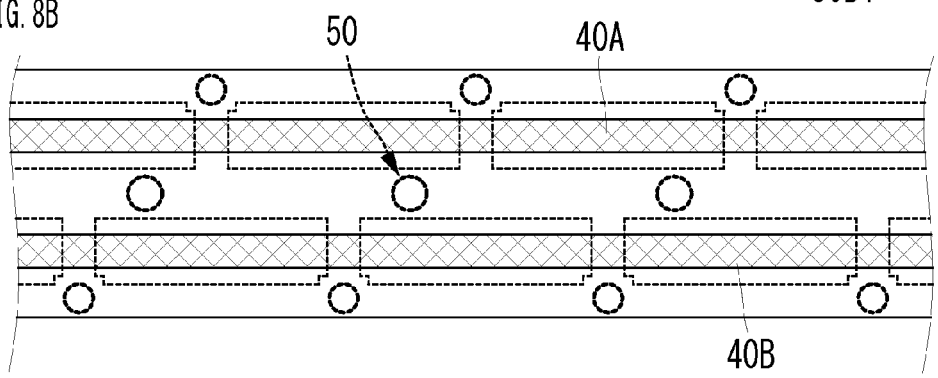
Figure 8C:
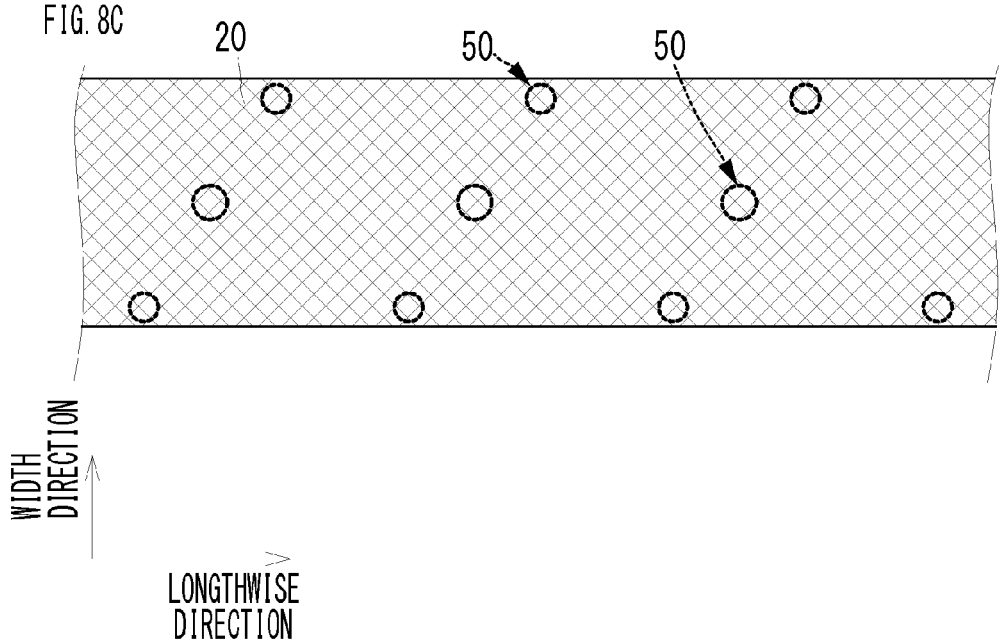

Next, a transmission line according to a fourth preferred embodiment of the present invention will be described with reference to drawings. FIGS. 8A to 8C are exploded plan views illustrating the structure of a main transmission line portion according to the fourth preferred embodiment of the present invention.

A main transmission line 10B of the present preferred embodiment is different from the main transmission line 10A according to the third preferred embodiment in the structures of auxiliary ground conductors, and the other configuration is the same. Accordingly, only points different from the main transmission line 10A according to the third preferred embodiment will be specifically described.

In auxiliary ground conductors 30A1 and 30A2, a substantially elongated conductor 312 located roughly in a middle position in the width direction, in which the auxiliary ground conductors 30A1 and 30A2 face each other, is shared by the first main line and the second main line. By adopting such a configuration, it is possible to reduce the width of the main transmission line 10, compared with a configuration in which no common and substantially elongated conductor is used by the first main line and the second main line.

In addition, in the configuration of the present preferred embodiment, the thickness direction connection conductors 50 provided in the substantially elongated conductor defining and serving as a portion shared by the first main line and the second main line are provided substantially at middle positions between the disposition positions of the bridge conductors 33A and 33B in the longitudinal direction. By adopting such a configuration, a ground is placed at positions at which the opening portions 34A of the first main line and the respective opening portions 34B of the second main line face each other. Accordingly, it is possible to secure higher isolation between the first main line and the second main line, and it is possible to further reduce or prevent crosstalk between a high-frequency signal transmitted through the first main line and a high-frequency signal transmitted through the second main line.

The disposition structure of the thickness direction connection conductors 50 may be applied to a case where a substantially elongated conductor on a side on which the first main line and the second main line face each other is not shared. However, since it is necessary to make the width of the substantially elongated conductor larger than the diameters of the thickness direction connection conductors 50, the width of the main transmission line 10 becomes large. However, in the configuration of the present preferred embodiment, the substantially elongated conductor on a side on which the first main line and the second main line face each other is shared. Accordingly, even if the width of the substantially elongated conductor is increased, it is possible to reduce the width of the main transmission line 10 as much as possible, and this configuration more effectively works.

Next, a transmission line according to a fifth preferred embodiment of the present invention will be described with reference to drawings. FIGS. 9A to 9C are exploded plan views illustrating the structure of a main transmission line portion according to the fifth preferred embodiment of the present invention.

A main transmission line 10C of the present preferred embodiment is different from the main transmission line 10B according to the fourth preferred embodiment in the structures of auxiliary ground conductors, and the other configuration is the same. Accordingly, only points different from the main transmission line 10B according to the fourth preferred embodiment will be specifically described.

In the main transmission line 10C of the present preferred embodiment, no thickness direction connection conductors are placed at positions of overlapping with substantially elongated conductors 31An and 32Bn located in two respective end portions of the dielectric body 110 in the width direction.

In such a configuration, since no thickness direction connection conductor 50 having a given diameter is provided, it is possible to reduce the widths of the substantially elongated conductors 31An and 32Bn. As a result, if the width of the dielectric body 110 is not changed, it is possible to increase the widths of the signal conductors 40A and 40B, and it is possible to reduce a transmission loss. In addition, in a case where the width of the dielectric body 110 is changed, it is possible to reduce the width of the dielectric body 110.

In addition, in the above-mentioned individual preferred embodiments other than the fifth preferred embodiment, the thickness direction connection conductors 50 are disposed in both the end portions of the dielectric body 110 in the width direction. By disposing such thickness direction connection conductors 50, it is possible to significantly reduce or prevent external interferences of the first main line and the second main line.

In addition, in the above-mentioned individual preferred embodiments, an example in which the widths of the opening portions in the main transmission line are kept constant is illustrated. However, a shape in which the width of each of the opening portions is sequentially increased from an end portion connecting to a corresponding bridge conductor toward the middle portion of the relevant opening portion in the longitudinal direction may be adopted.

In addition, in the above-mentioned individual preferred embodiments, an example in which the widths of the signal conductors in the main transmission line preferably are kept constant is illustrated. However, the widths of portions of the signal conductors facing the opening portions may be increased. At this time, the widths of the signal conductors are increased without not overlapping with the substantially elongated conductors when the flat cable is viewed in the thickness direction. As a result, it is possible to reduce the high-frequency resistances of the signal conductor, and it is possible to reduce the conductor loss of the flat cable.

In addition, while, in the above-mentioned preferred embodiments, an example in which two transmission lines are provided using one dielectric body, three or more transmission lines may be provided using one dielectric body. In this case, it is only necessary for at least adjacent transmission lines to have the above-mentioned configuration of the bridge conductors.

Next, a transmission line according to a sixth preferred embodiment of the present invention will be described with reference to drawings. FIG. 10 is the external perspective view of a flat cable including the transmission line according to the sixth preferred embodiment of the present invention. FIGS. 11A to 11C are exploded plan views illustrating the structures of extending transmission lines of the flat cable according to the sixth preferred embodiment of the present invention. In addition, while FIGS. 11A to 11C illustrate the structures of extending transmission lines in one of two end portions of the flat cable in the lengthwise direction thereof, extending transmission lines in the other end portion define the same structures.

Compared with the flat cable 60 illustrated in the first preferred embodiment, in a flat cable 60D illustrated in the present preferred embodiment, the connectors 61A1, 61A2, 61B1, and 61B2 are disposed on an auxiliary ground conductor side, and the reference ground conductors are disposed on a side opposite to the connectors with the signal conductor sandwiched therebetween. In addition, the structures of the extending transmission lines are different from those of the extending transmission lines illustrated in the first preferred embodiment. The other basic configuration is the same as that of the flat cable 60 illustrated in the first preferred embodiment. Accordingly, only points different from the flat cable 60 illustrated in the first preferred embodiment will be described.

The flat cable 60D includes the main transmission line 10D, extending transmission lines 11AD, 11BD, 12AD, and 12BD, and the connectors 61A1, 61A2, 61B1, and 61B2. Compared with the main transmission line 10 illustrated in the first preferred embodiment, the main transmission line 10D forms a structure in which auxiliary grounds are disposed on a connector side with respect to the signal conductors and reference grounds are disposed on a side opposite to the connectors of the signal conductors.

In the same way as the extending transmission lines 11B and 12B illustrated in the first preferred embodiment, the extending transmission lines 11BD and 12BD each preferably have a substantially elongated shape that extends in the same direction as the lengthwise direction of the main transmission line 10D. These extending transmission lines 11BD and 12BD correspond to a "first extending transmission line" of a preferred embodiment of the present invention.

The extending transmission lines 11AD and 12AD each include a substantially straight-line portion ReS, which extends in the same direction as the lengthwise direction of the main transmission line 10D, and a substantially curved portion ReC, which is curved in a direction different from the lengthwise direction. These extending transmission lines 11AD and 12AD correspond to a "second extending transmission line" of a preferred embodiment of the present invention.

As illustrated in FIGS. 11A to 11C, the extending transmission line 11BD includes a substantially elongated dielectric body 110BN that extends in the lengthwise direction of the main transmission line 10D. One of two end portions of the dielectric body 110BN in the lengthwise direction is connected to the dielectric body 110 configuring a main line conductor. The other end portion of the dielectric body 110BN is partially wider. In other words, the length of the other end portion of the dielectric body 110BN in the lateral direction thereof is longer than that on a dielectric body 110 side.

In the dielectric body 110BN, an auxiliary ground conductor 30BN, a signal conductor 40BN, and a reference ground conductor 20BN are disposed with leaving spaces therebetween in the thickness direction.

The auxiliary ground conductor 30BN includes substantially elongated conductors 31BN and 32BN that extending the lengthwise direction of the dielectric body 110BN. The substantially elongated conductor 31BN is connected to the substantially elongated conductor 31B of the main transmission line 10D, and the substantially elongated conductor 32BN is connected to the substantially elongated conductor 32B of the main transmission line 10D. The substantially elongated conductors 31BN and 32BN are provided in the vicinities of two respective end portions of the dielectric body 110BN in the lateral direction. The substantially elongated conductors 31BN and 32BN are connected to each other by a plurality of bridge conductors 33BN disposed with distances therebetween in a extending direction.

The substantially elongated conductors 31BN and 32BN are connected to each other by a connector connecting conductor 43BN, in the other end portion of the dielectric body 110BN (an end portion on a side opposite to a side that connects to the dielectric body 110). The connector connecting conductor 43BN is provided in nearly the entire surface of a wide portion in the other end portion of the dielectric body 110BN, and an opening portion, in the middle portion of which no conductor is formed, is provided. In the middle portion of this opening portion, a connector connecting conductor 42BN preferably has a shape of not connecting to the connector connecting conductor 43BN. These connector connecting conductors 42BN and 43BN are connected to respective terminals of the connector 61B1.

The signal conductor 40BN preferably has a shape that extends in the lengthwise direction of the dielectric body 110BN and disposed roughly at a middle position in the lateral direction of the dielectric body 110BN. The signal conductor 40BN is connected to the signal conductor 40B of the main transmission line 10D. The signal conductor 40BN is disposed so as not to overlap with the substantially elongated conductor 31BN or 32BN of the auxiliary ground conductor 30BN when the dielectric body 110BN is viewed in plan. The signal conductor 40BN is connected to a connector connecting conductor 41BN in the other end portion of the dielectric body 110BN. The connector connecting conductor 41BN is connected to the connector connecting auxiliary conductor 42BN through a corresponding one of the thickness direction connection conductors 50.

The reference ground conductor 20BN preferably has a shape that extends in the lengthwise direction of the dielectric body 110BN. The width of the reference ground conductor 20BN (the length thereof in the lateral direction) is approximately the same as the width of the dielectric body 110BN (the length thereof in the lateral direction). The reference ground conductor 20BN is connected to the substantially elongated conductors 31BN and 32BN of the auxiliary ground conductor 30BN through the thickness direction connection conductors 50. The reference ground conductor 20BN is connected to a connector connecting conductor 44BN in the other end portion of the dielectric body 110BN. The connector connecting conductor 44BN is connected to the connector connecting auxiliary conductor 41BN through a corresponding one of the thickness direction connection conductors 50.

As illustrated in FIGS. 11A to 11B, the extending transmission line 11AD includes a substantially elongated dielectric body 110AN including a substantially straight-line portion ReS, which extends in the same direction as the lengthwise direction of the main transmission line 10D, and a substantially curved portion ReC, which is curved in a direction different from the lengthwise direction. One of two end portions of the dielectric body 110AN in the lengthwise direction is connected to the dielectric body 110 configuring a main line conductor. The other end portion of the dielectric body 110AN is partially wider. In other words, the length of the other end portion of the dielectric body 110AN in the lateral direction thereof is longer than that on a dielectric body 110 side.

In the dielectric body 110AN, an auxiliary ground conductor 30AN, a signal conductor 40AN, and a reference ground conductor 20AN are disposed with leaving spaces therebetween in the thickness direction.

The auxiliary ground conductor 30AN includes substantially elongated conductors 31AN and 32AN. The substantially elongated conductors 31AN and 32AN each preferably have, in the substantially straight-line portion ReS, a shape that extends in the lengthwise direction of the dielectric body 110AN and each form, in the substantially curved portion ReC, a shape that extends along the substantially curved shape of the dielectric body 110AN. The substantially elongated conductor 31AN is connected to the substantially elongated conductor 31A of the main transmission line 10D, and the substantially elongated conductor 32AN is connected to the substantially elongated conductor 32A of the main transmission line 10D. The substantially elongated conductors 31AN and 32AN are provided in the vicinities of two respective end portions of the dielectric body 110AN in the lateral direction. The substantially elongated conductors 31AN and 32AN are connected to each other by a plurality of bridge conductors 33AN disposed with distances therebetween in a extending direction.

The substantially elongated conductors 31AN and 32AN are connected to each other by a connector connecting conductor 43AN, in the other end portion of the dielectric body 110AN (an end portion on a side opposite to a side that connects to the dielectric body 110). The connector connecting conductor 43AN is provided in nearly the entire surface of a wide portion in the other end portion of the dielectric body 110AN, and an opening portion, in the middle portion of which no conductor is formed, is provided. Roughly in the middle portion of this opening portion, a connector connecting conductor 42AN is provided in a shape of not connecting to the connector connecting conductor 43AN. These connector connecting conductors 42AN and 43AN are connected to respective terminals of the connector 61A1.

The signal conductor 40AN preferably has, in the substantially straight-line portion ReS, a shape that extends in the lengthwise direction of the dielectric body 110AN and forms, in the substantially curved portion ReC, a shape that extends along the substantially curved shape of the dielectric body 110AN. The signal conductor 40AN is disposed roughly at a middle position in the lateral direction of the dielectric body 110BN. The signal conductor 40AN is connected to the signal conductor 40A of the main transmission line 10D. The signal conductor 40AN is disposed so as not to overlap with the substantially elongated conductor 31AN or 32AN of the auxiliary ground conductor 30AN when the dielectric body 110AN is viewed in plan. The signal conductor 40AN is connected to a connector connecting conductor 41AN in the other end portion of the dielectric body 110AN. The connector connecting conductor 41AN is connected to the connector connecting auxiliary conductor 42AN through a corresponding one of the thickness direction connection conductors 50.

The reference ground conductor 20AN preferably has, in the substantially straight-line portion ReS, a shape that extends in the lengthwise direction of the dielectric body 110AN and forms, in the substantially curved portion ReC, a shape that extends along the substantially curved shape of the dielectric body 110AN. The width of the reference ground conductor 20AN (the length thereof in the lateral direction) is approximately the same as the width of the dielectric body 110AN (the length thereof in the lateral direction). Only in the portion of the substantially straight-line portion ReS, the reference ground conductor 20AN is connected to the substantially elongated conductors 31AN and 32AN of the auxiliary ground conductor 30AN through the thickness direction connection conductors 50. The reference ground conductor 20AN is connected to a connector connecting conductor 44AN in the other end portion of the dielectric body 110AN. The connector connecting conductor 44AN is connected to the connector connecting auxiliary conductor 41AN through a corresponding one of the thickness direction connection conductors 50.

Using such a structure of the extending transmission lines, it is possible to improve work efficiency at the time of connecting the flat cable 60D to the circuit mounting substrates. Specifically, in a case of connecting the flat cable 60D to the circuit mounting substrates, first the connectors 61B1 and 61B2 of the substantially linear extending transmission lines 11BD and 12BD are connected (fixed) to the circuit mounting substrates, thus fixing the flat cable 60D to the circuit mounting substrates. As a result, it is possible to temporarily fix the flat cable 60D to the circuit mounting substrates.

After that, the connectors 61A1 and 61A2 of the extending transmission lines 11AD and 12AD having the substantially curved portions ReC are connected (fixed) to the circuit mounting substrates. In this way, by providing the substantially curved portions ReC in the extending transmission lines 11AD and 12AD, it is possible to give the degree of freedom for arrangement to the extending transmission lines 11AD and 12AD. As a result, it is possible to easily connect (fix) the connectors to the circuit mounting substrates even if there are many connector connecting points.

Furthermore, since, in the configuration of the present preferred embodiment, no thickness direction connection conductor is provided in the substantially curved portion ReC, the substantially curved portion ReC has high flexibility, compared with the substantially straight-line portion ReS. Accordingly, it is possible to more easily connect (fix) the connectors to the circuit mounting substrates. In addition, it is possible to prevent a change in characteristic impedance, caused by expansion or contraction of the substantially curved portion ReC.

In addition, in the sixth preferred embodiment, one of the two extending transmission lines connected to one of two end portions of the main transmission line 10D in the lengthwise direction is put into a substantially linear structure of relatively low flexibility and the other is put into a structure having a substantially curved portion of relatively high flexibility. However, in a case of having three or more extending transmission lines, it is only necessary to provide at least one substantially linear structure and at least one structure having the substantially curved portion.

In addition, the sixth preferred embodiment illustrates a case where, in a state of applying no external force, substantially straight-line distances from the main transmission line 10D to the respective connectors are equal or substantially equal to each other in the transmission lines 11AD and 11BD and those are equal or substantially equal to each other in the transmission lines 12AD and 12BD. However, the substantially straight-line distances may be different.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
a plate-shaped or substantially plate-shaped dielectric body that has a predetermined thickness;
a signal conductor that is disposed within the dielectric body and extends in a transmission direction;
a reference ground conductor disposed on a side of one of two end surfaces of the dielectric body in a thickness direction;
an auxiliary ground conductor disposed on a side of the other end surface of the dielectric body in the thickness direction; and
a thickness direction connection conductor that penetrates the dielectric body to connect the reference ground conductor and the auxiliary ground conductor to each other; wherein
the auxiliary ground conductor includes a first elongated conductor or substantially elongated conductor and a second elongated conductor or substantially elongated conductor that extend in the transmission direction and are disposed with a predetermined distance therebetween in a direction perpendicular or substantially perpendicular to the transmission direction, and bridge conductors that connect, with predetermined distances therebetween in the transmission direction, the first elongated conductor or substantially elongated conductor and the second elongated conductor or substantially elongated conductor to each other;
a plurality of individual transmission portions, which are each based on a set of the reference ground conductor, the auxiliary ground conductor, and the signal conductor, are disposed with respect to the dielectric body, in the direction perpendicular or substantially perpendicular to the transmission direction; and
positions of the bridge conductors in the transmission direction in the individual transmission portions adjacent to each other are different.

2. The transmission line according to claim 1, wherein positions of the bridge conductors in the transmission direction in one of the individual transmission portions are located roughly in middle portions between positions of the bridge conductors adjacent to each other in the transmission direction in another of the individual transmission portions adjacent to the one of the individual transmission portions.

3. The transmission line according to claim 1, wherein the thickness direction connection conductor is provided at least at each of positions where the first and second elongated conductors or substantially elongated conductors in the respective adjacent individual transmission portions, which face each other, and the reference ground conductor overlap with each other in the thickness direction.

4. The transmission line according to claim 1, wherein the reference ground conductors in the adjacent individual transmission portions are integrated with each other.

5. The transmission line according to claim 1, wherein the reference ground conductors in the adjacent individual transmission portions are separated from each other with a predetermined distance therebetween.

6. The transmission line according to claim 1, wherein the first elongated conductor or substantially elongated conductor in one of the individual transmission portions and the second elongated conductor or substantially elongated conductor in another one of the individual transmission portions, which are adjacent to each other, are integrated with each other, the one and the another of the individual transmission portions being adjacent to each other.

7. The transmission line according to claim 4, wherein the thickness direction connection conductor is provided only at a position where the first elongated conductor or substantially elongated conductor and the second elongated conductor or substantially elongated conductor, which are integrated with each other, and the reference ground conductor overlap with each other in the thickness direction.

8. A transmission line apparatus comprising:
the transmission line according to claim 1 that defines a main transmission line portion;

extending transmission lines connected to two end portions of the main transmission line portion and provided for each of the individual transmission portions; wherein the extending transmission lines connected to one end portion of the main transmission line portion include:

a first extending transmission line that extends in an extending direction of the main transmission line portion and has a same conductor configuration as that of the main transmission line portion; and a second extending transmission line including a straight-line or substantially straight-line portion that extends in the extending direction of the main transmission line portion and has a same conductor configuration as that of the main transmission line portion, and a curved or substantially curved portion that defines a shape that is curved or substantially curved in a direction different from the straight-line or substantially straight-line portion.

9. The transmission line apparatus according to claim 8, wherein in the curved or substantially curved portion in the second extending transmission line, an auxiliary ground conductor, a signal conductor, and a reference ground conductor are disposed in the thickness direction and are not connected to one another.

10. The transmission line according to claim 5, wherein the reference ground conductors in the adjacent individual transmission portions separated from each other with the distance therebetween are partially connected to each other by a first connection conductor portion.

11. The transmission line according to claim 5, wherein the auxiliary ground conductors separated with respect to the respective individual transmission portions are partially connected to each other by a second connection conductor portion.

12. The transmission line according to claim 10, wherein the auxiliary ground conductors separated with respect to the respective individual transmission portions are partially connected to each other by a second connection conductor portion.

13. The transmission line according to claim 12, wherein a non-formation portion of a conductor is provided in at least one of the first connection conductor portion and the second connection conductor portion.

14. The transmission line according to claim 13, wherein connection conductors that extend in the thickness direction are provided in the first connection conductor portion and the second connection conductor portion or at a position at which the first connection conductor portion is connected in the reference ground conductor and a position at which the second connection conductor portion is connected in the auxiliary ground conductor.

15. The transmission line according to claim 13, wherein between the non-formation portion of a conductor provided in at least one of the first connection conductor portion and the second connection conductor portion and the signal conductor when viewed in plan, the thickness direction connection conductor that connects the reference ground conductor and the auxiliary ground conductor to each other is provided.

16. The transmission line according to claim 14, wherein between the non-formation portion of a conductor provided in at least one of the first connection conductor portion and the second connection conductor portion and the signal conductor when viewed in plan, the thickness direction connection conductor that connects the reference ground conductor and the auxiliary ground conductor to each other is provided.

17. An electronic device comprising:
the transmission line according to claim 1;
a plurality of circuit elements connected by the transmission line; and
a housing in which the circuit elements are embedded.

18. An electronic device comprising:
the transmission line apparatus according to claim 8;
a plurality of circuit elements connected by the transmission line; and
a housing in which the circuit elements are embedded.

* * * * *